(12) United States Patent
Tomofuji et al.

(10) Patent No.: US 6,850,581 B2
(45) Date of Patent: Feb. 1, 2005

(54) TIMING CIRCUIT

(75) Inventors: Hiroaki Tomofuji, Kawasaki (JP); Hiroshi Hamano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/267,669

(22) Filed: Oct. 10, 2002

(65) Prior Publication Data

US 2003/0039328 A1 Feb. 27, 2003

Related U.S. Application Data

(62) Division of application No. 09/041,778, filed on Mar. 13, 1998, now Pat. No. 6,496,552.

(30) Foreign Application Priority Data

Oct. 20, 1997 (JP) .............................................. 9-287098

(51) Int. Cl.[7] .................................................. H04D 3/24
(52) U.S. Cl. ...................................... 375/355; 327/175
(58) Field of Search ................................ 375/373, 354, 375/355, 371; 327/175, 75, 157

(56) References Cited

U.S. PATENT DOCUMENTS

| | | | |
|---|---|---|---|
| 5,008,636 A | 4/1991 | Marinson et al. | |
| 5,278,520 A | 1/1994 | Parker et al. | |
| 5,347,276 A | 9/1994 | Gilardi | |
| 5,397,945 A | * 3/1995 | Shum et al. ................... | 327/77 |
| 5,418,806 A | 5/1995 | Araki | |
| 5,479,125 A | 12/1995 | Tran | |
| 5,481,228 A | 1/1996 | Badyal | |
| 5,898,395 A | 4/1999 | Werrbach et al. | |
| 5,912,574 A | * 6/1999 | Ghagwan ..................... | 327/157 |
| 5,920,217 A | 7/1999 | Mellot | |
| 5,941,989 A | 8/1999 | Klein | |

FOREIGN PATENT DOCUMENTS

| | | |
|---|---|---|
| JP | 1-97034 | 4/1989 |
| JP | 2-122433 | 5/1990 |
| JP | 5-259896 | 10/1993 |

OTHER PUBLICATIONS

T. Saito, et al., "Comparison Between Modulation Formats for IM–DD Optical Amplifier Repeater System", Opto–Electronics Research Laboratories.

* cited by examiner

Primary Examiner—Kevin M Burd
(74) Attorney, Agent, or Firm—Staas & Halsey LLP

(57) ABSTRACT

Disclosed is a timing circuit for generating a clock signal which indicates a timing for discriminating a data signal. The timing circuit includes a branching circuit for branching a data signal in two directions, a duty monitoring circuit for monitoring the duty of a first data signal output from the branching circuit, a duty varying circuit for varying the duty of a second data signal output from the branching circuit, a control circuit for controlling the duty varying circuit on the basis of the duty information output from the duty monitoring circuit so that the duty of the data signal to be output has a predetermined value and a clock signal generator for generating the clock signal for discriminating a data signal which is synchronous with the data signal output from the duty varying circuit.

5 Claims, 25 Drawing Sheets

DUTY 100%

DUTY>100%

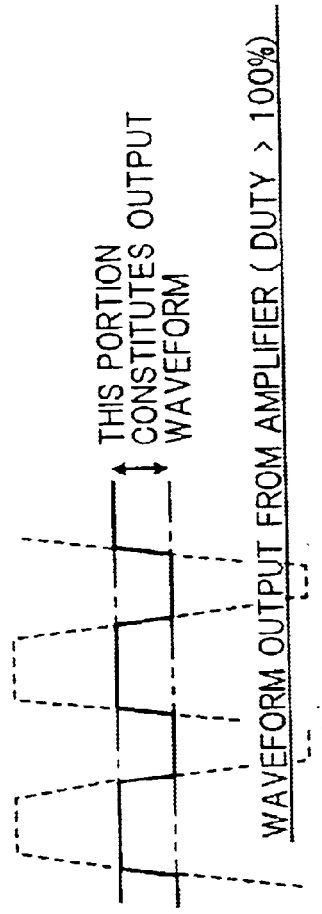
FIG.7A
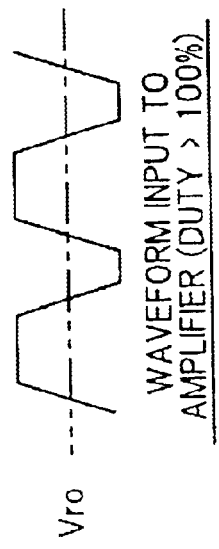
WHEN THE REFERENCE LEVEL IS SET AT $V_{ro}$, THE DUTY OF THE OUTPUT WAVEFORM >100%
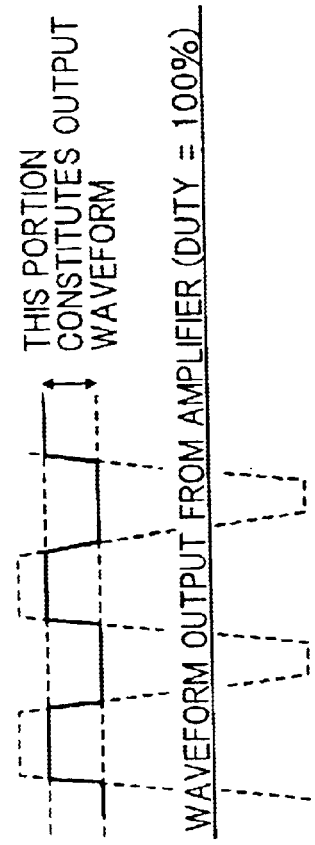
FIG.7B
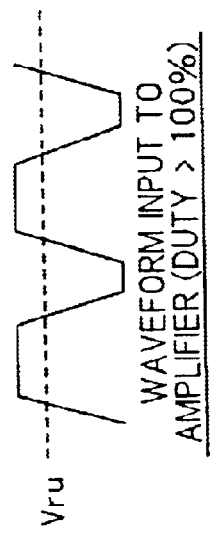
WHEN THE REFERENCE LEVEL IS SET AT $V_{ru}$, THE DUTY OF THE OUTPUT WAVEFORM = 100% NUMBER

FIG.25 PRIOR ART
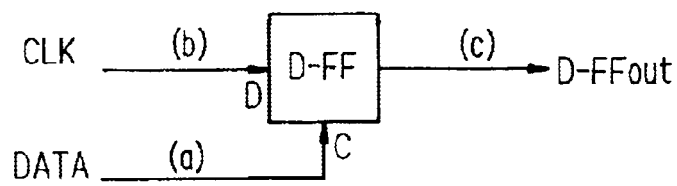
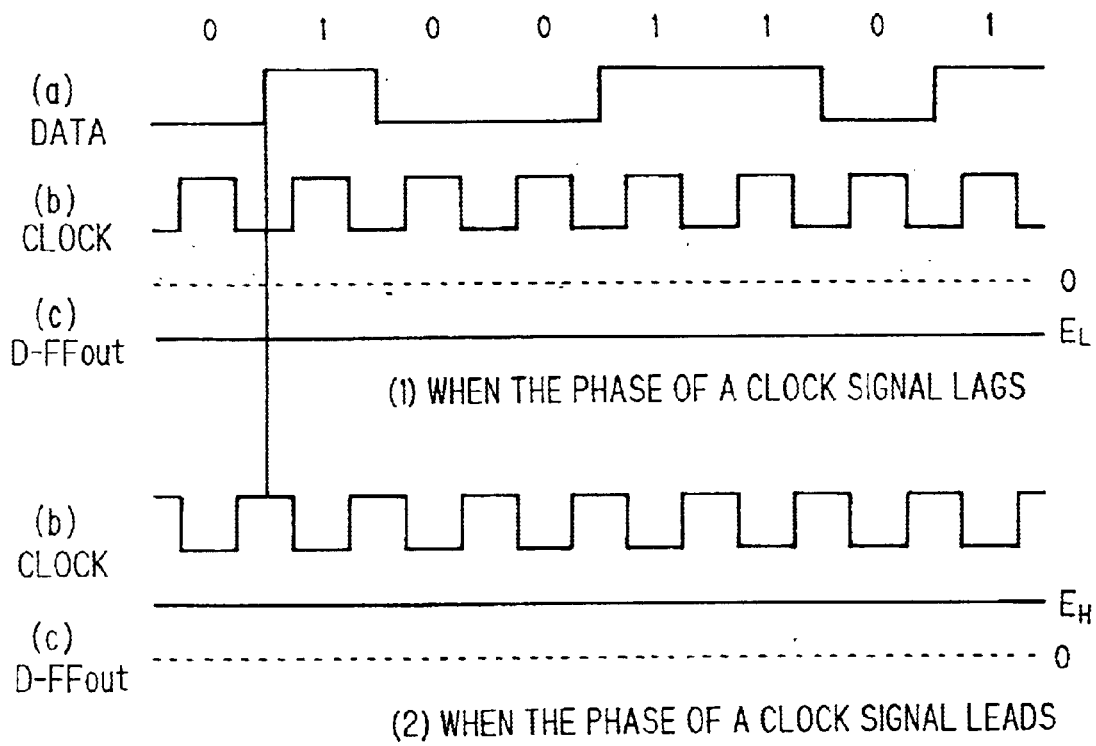
(1) WHEN THE PHASE OF A CLOCK SIGNAL LAGS
(2) WHEN THE PHASE OF A CLOCK SIGNAL LEADS

DUTY = 100%

FIG.30
(1) INPUT (CLOCK) TO DATA TERMINAL OF D-FFS 1, 2
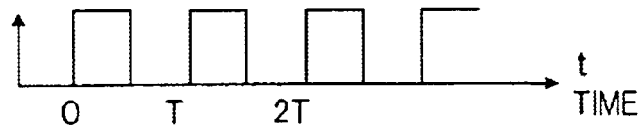
(2) INPUT (DATA) TO CLOCK TERMINAL OF D-FF 1
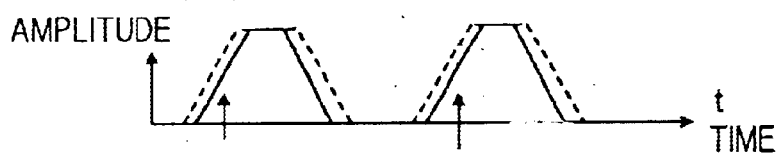
(3) OUTPUT (DETECTION OF RISING EDGE) OF D-FF 1
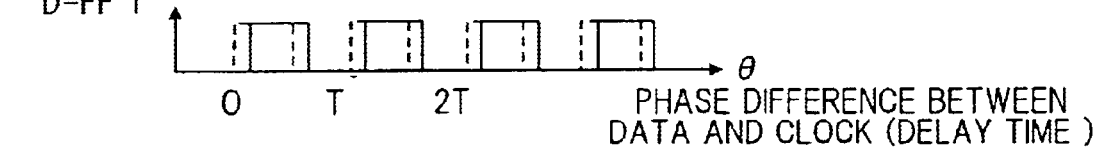
(4) INPUT TO CLOCK TERMINAL OF D-FF 2
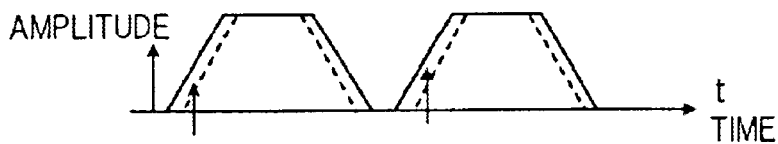
(5) OUTPUT (DETECTION OF FALLING EDGE) OF D-FF 2
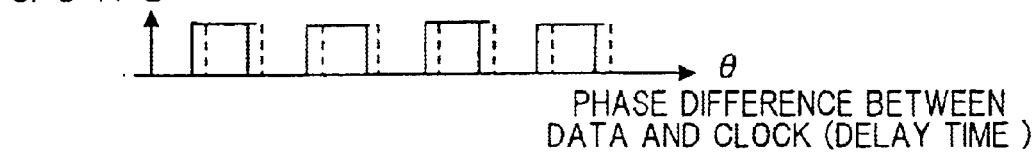
(6) PHASE DETECTION SIGNAL OUTPUT FROM ADD (PHASE DETECTION SIGNAL PDS)
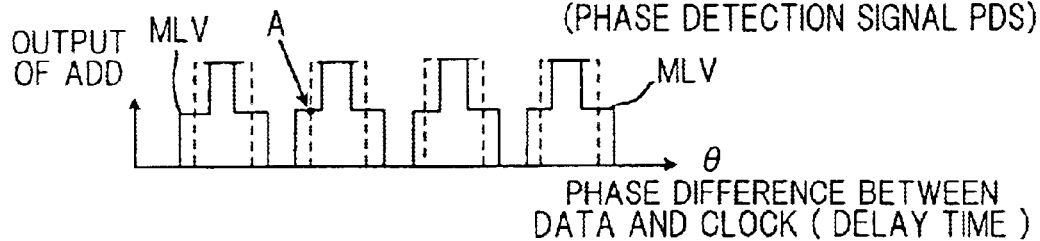

TIMING CIRCUIT

CROSS-REFERENCE TO RELATED APPLICATIONS

This application is a divisional of application number 09/041,778, filed Mar. 13, 1998, now U.S. Pat. No. 6,496,552 B2.

BACKGROUND OF THE INVENTION

The present invention relates to a timing circuit of an optical receiver in a high-speed optical communication system and, more particularly, to a timing circuit for generating a clock signal which indicates a timing for discriminating a received data signal.

The optical receiver in a high-speed optical communication system converts a data waveform which is distorted during transmission or a data waveform carrying noise into a clean waveform, in other words, executes what is called data regeneration. In such data regeneration, the optical receiver generates a clock signal by using a received data signal, and a discriminating portion reproduces data on the basis of the timing with which the clock signal is generated.

FIG. 19 shows an example of an optical receiver in an optical communication system. The reference numeral 1 represents an optoelectric conversion circuit for converting an optical signal into an electric signal, 2 an equalizing amplifier for equalizing and amplifying a data signal of, for example 10 Gbps which is output from the optoelectric conversion 1, 3 a timing circuit for extracting a clock signal, which has a frequency same as that as the bit rate, from the data signal received, and 4 a discriminating circuit for discriminating the data signal by using the clock signal which is output from the timing circuit 3. The optical signal transmitted through an optical fiber is converted by the optoelectric conversion circuit 1 into an electric signal, and equalized and amplified by the equalizing amplifier 2. The timing circuit 3 extracts a clock signal from the equalized waveform and triggers the discriminating circuit 4. The discriminating circuit 4 judges whether the equalized waveform is "0" or "1" at the point of time of sampling, and restores the original code pulse. Since there is a change in the delay time in the transmission line or the like, the discriminating circuit 4 is triggered by a clock signal which is synchronous with the data signal received.

In optical communication, an NRZ code, an RZ code, etc. is used as a transmission line code. In an optical communication apparatus of not less than 600 Mbps, an NRZ code in which the bands required for the electric circuit and the optical device are not strict is generally used. When an NRZ code is used, since a data signal contains no clock component, it is necessary to generate a clock signal by processing the data signal. A conventional timing circuit of an optical receiver for generating such a clock signal has either (1) a structure (FIG. 20) using a timing filter or (2) a structure (FIG. 21) using a PLL.

FIG. 20 shows the structure of a timing circuit using a timing filter. The timing circuit is composed of a nonlinear extractor 110 for detecting the rising edge and the falling edge of an input data signal, a bandpass filter 111 having a center frequency identical with the bit rate of the data signal, and a limiting amplifier 112 as a narrow band amplifier. The nonlinear extractor 110 includes a branching circuit 110a for branching a data signal in two directions, a delay circuit 110b for delaying a first branched data signal by a predetermined time (½ of the time equivalent to 1 bit), and or EXOR (Exclusive OR) circuit 110c for executing an exclusive OR operation of the second branched data signal and the output signal of the delay circuit 110b and generating an edge signal having a pulse at the rising edge and the falling edge of the data signal. FIG. 22 shows an operating waveform. The EXOR circuit 110c detects the rising edge and the falling edge of the data signal and generates a pulse, the band pass filter 111 extracts the clock component having the same frequency as that of the bit rate of the data signal, and limiting amplifier 112 amplifies the clock component to a predetermined amplitude. Herein, the structure of the nonlinear extractor 110 having a combination of a differentiating circuit and a full-wave rectifier has also been proposed.

FIG. 21 shows the structure of a timing circuit using a PLL. The timing circuit is provided with a phase detector 121 for comparing the phases of a data signal and a clock signal and outputting the phase difference, a level converter 122 for converting the output level of the phase detector 121, a loop filter 123 for smoothing the voltage signal corresponding to the phase difference which is output from the level converter 122, and a voltage controlled oscillator (VCO) 124 for generating a clock signal having the frequency corresponding to the output of the loop filter 123. As examples of the structure of the phase detector 121, those shown in FIGS. 23 and 24 have been proposed.

The phase detector 121 shown in FIG. 23 compares the phase of a data signal DATA with the phase of a clock signal both at the rising edge and the falling edge of the data signal DATA, synthesizes the phase differences of the data signal at the rising edge and the falling edge, and executes PLL control. The phase detector 121 is provided with two D flip flops (D-FFs) 201, 202 which function as phase detectors, an inverting gate 203 for inverting the logic of the data signal DATA and an adder 204 for adding the outputs of the D-FFs 201, 202.

The D-FF stores the level ("1" or "0") of the clock signal CLOCK input to a data input terminal (terminal D) at the rising edge of each data signal DATA, *DATA input to a clock input terminal (terminal C), and holds the level until the next data signal rises. Therefore, when the phase of the clock signal CLOCK lags behind that of the data signal DATA, as shown in (1) of FIG. 25, the D-FF outputs a low-level ($E_L$) signal D-FF out. On the other hand, when the phase of the clock signal CLOCK leads that of the data signal DATA, as shown in (2) of FIG. 25, the D-FF outputs a high-level ($E_H$) signal D-FF out.

In this manner, the D-FF 201 outputs a signal corresponding to the phase of the clock signal at the rising edge of the data signal, while the D-FF 202 outputs a signal corresponding to the phase of the clock signal at the falling edge of the data signal. The adder 204 synthesizes these signals and outputs a phase detection signal PDS. The timing circuit having a PLL structure controls the phase of the clock signal so that the phase detection signal PDS has a preset level. For example, when the duty of the data signal varies to less than 100%, the rising edge of the data signal lags behind that of the clock signal and the falling edge of the data signal leads that of the clock signal. The phase detector 121 outputs the phase detection signal PDS which corresponds to the difference between the amount of lag and the amount of lead and the timing circuit outputs the clock signal CLOCK so that the amount of lag may be equal to the amount of lead.

The phase detector shown in FIG. 24 detects the rising edge and the falling edge of a data signal DATA and compares the phases of a rising edge signal EGU and a falling edge signal EGD with the phase of a clock signal CLOCK. The phase detector is provided with an edge detector 251 and a D-FF 252. The D-FF 252 outputs the level of the clock signal CLOCK as a phase detection signal PDS when the rising edge signal EGU and the falling edge signal EGD are produced. Since the phase detector is provided with the edge detector 251, the same operation as that of the phase detector shown in FIG. 23 is carried out with only one D-FF.

FIG. 26 is an explanatory view of the relationship between the phase difference θ between the clock signal CLOCK and the data signal DATA and the output (phase detection signal PDS) of the phase detector. In this drawing, the duty of the data signal DATA is 100%, and the phase of the data signal DATA leads the phase of the clock signal CLOCK. The word "duty" will be defined strictly later, but briefly speaking, when the bit rate is f (=1/T), the duty is the ratio of the period $T_1$ of a data signal "1" and T. When the duty is 100% (T=$T_1$), as shown in FIG. 26, the phase relationship between the rising edge of the data signal and the clock signal is the same with the phase relationship between the falling edge of the data signal and the clock signal. Consequently, the waveform of the output (phase detection signal PDS) of the phase detector is a rectangular waveform which alternates with a phase difference period of T/2.

It is possible to fix the phase relationship between the clock signal CLOCK and the data signal DATA by controlling the phase of the clock signal so that the clock signal rises at the position at which the data signal DATA is switched over from a LOW level to a HIGH level. However, in the phase detection signal PDS, the switching characteristic between the LOW level and the HIGH level is steep (the level is binary), continuous phase control of the clock signal is impossible, so that the control becomes unstable. That is, if the clock signal is produced by using the binary phase detection signal PDS and the phases of the data signal and the clock signal are made coincident with each other by feeding the clock signal back to the phase detector, the control becomes unstable at a discontinuous point of the phase detection signal PDS. As a countermeasure, a microsignal having a low frequency is superimposed on the clock input terminal (terminal C) of the D-FF for the purpose of modulation. In this manner, it is possible to provide the phase of the data signal input to the clock input terminal C with perturbation, which enables the phase detection signal PDS to gently incline with the phase difference θ as indicated with the broken line in FIG. 26. Stable control is thus enabled.

In a conventional high-speed communication system, an NRZ code is used, and the duty is approximately 100% before and after transmission. However, with an increase in the transmission speed, the pulse width per bit becomes narrow and the transmission is influenced by a nonlinear effect and the wavelength dispersion of the optical fiber, which leads to a large distortion of the transmission waveform. FIG. 27A shows the waveform of light signal on the transmitter side when the duty is 100% (T=$T_1$), FIG. 27B shows the waveform of transmission light (on the left side) and the equalized waveform (on the right side) when the duty is less than 100% by the distortion, and FIG. 27C shows the waveform of transmission light (on the left side) and the equalized waveform when the duty is more than 100% by the distortion.

As is clear from these drawings, the duty of the received waveform greatly changes due to waveform distortion, and the change is 50% to 120% depending upon the transmission conditions. The duty, by reference to FIG. 27A, is defined as the ratio of the duration ($T_1$) of one pulse at the center of the crest value and one time slot interval (T).

Although it is possible to relieve the distortion of the transmission waveform by inserting a dispersion compensating fiber or the like into a transmission line, since a high cost is required, it is desirable to enable the longest-possible-distance transmission without using such an accessory part. Thus, an optical receiver is required to receive a largely distorted waveform without the need for compensating the wavelength dispersion and accurately reproduce the original data.

As shown in the literature ("Comparison between codes in IM-DD Optical Amplifier Repeater System" by Saito et al, pp 4 to 77, The Institute of Electronics, Information and Communication Engineers, Spring 1992), the transmission characteristics are improved by using an RZ code under some transmission conditions. A timing circuit which can use both an RZ code and an NRZ code is therefore desirable. When an RZ code is used, the duty of the waveform input to an optical receiver is 50%.

A change in the duty exerts a deleterious influence on the operation of a timing circuit. In the timing circuit using a timing filter shown in FIG. 20, if the duty reduces, the phase of the data rising edge detection pulse RP which reaches to a HIGH level at the rising edge of the data signal lags while the phase of the data falling edge detection pulse TP which reaches to a HIGH level at the falling edge of the data signal leads, as shown in FIG. 22. These pulses are synthesized, and a clock component is extracted from the synthesized pulse. Although the phase of the extracted clock component does not change, since there is a cancelled component, the clock component extracted is reduced. When the duty becomes 50%, the phases of the rising edge detection pulse and the falling edge detection pulse become opposite, so that the clock component of the bit rate becomes zero and the nonlinear extractor 110 does not operate normally.

Each of FIGS. 28A, 28B and 28C shows the waveform of the signal output from the EXOR circuit 110c in a case where duty is 100%, 75% and 50% respectively. By reference to FIG. 28C, it is apparent that a clock component whose frequency is identical with that of the bit rate of the data disappears from the EXOR output signal. Like the decrease of the duty, the clock component reduces in accordance with the increase of the duty. FIG. 29 shows the relationship between the duty of the data signal and an extracted clock component.

In the timing circuit using a PLL shown in FIG. 21, if the phase detector 121 has the structure shown in FIG. 24, the timing circuit does not operate normally when the duty becomes 50% in the same way as the timing circuit using a timing filter. If the phase detector 121 has the structure shown in FIG. 23, when the duty becomes small (or large), the waveform of the phase detection signal PDS is such as that shown in (6) of FIG. 30, and an intermediate level MLV between the HIGH level and the LOW level generates. The intermediate level MLV has a length represented by:

(100-duty(%))×360°/100.

In FIG. 30, (1) shows the clock signal CLOCK input to the terminals D of the D-FFs 201, 202;

(2) shows the data signal DATA input to the terminal C of the D-FF 201, wherein the broken line shows the data signal DATA when the duty is 100%, and the solid line the data signal DATA when the duty is less than 100%;

(3) shows the characteristic which shows the relationship between the output (rising edge detection output) of the D-FF 201 and the phase difference θ;

(4) shows the inverting data signal *DATA (the inverting signal of the data signal) input to the terminal C of the D-FF 202;

(5) shows the characteristic which shows the relationship between the output (falling edge detection output) of the D-FF 202 and the phase difference θ; and (6) shows the phase detection output (phase detection signal PDS) obtained by synthesizing the output of the D-FFs 201, 202.

In the waveforms shown in FIG. 30, no low-frequency signal is superimposed on the clock input terminal C of the D-FF, so that the phase of the data signal is not provided with perturbation. Actually, however, a low-frequency signal is applied to the clock input terminal C of the D-FF, so that each D-FF output has a gentle inclination (see FIG. 26). In order to make the relationship between the data signal DATA and the clock signal CLOCK constant irrespective of the duty, it is desirable to fix the phase at the point A in (6) of FIG. 30. In order to detect the point A, it is necessary to increase the amount of perturbation which is applied to the phase of the data signal input to the clock input terminal C by the amount corresponding to the difference between the current duty and the duty of 100%. In other words, in order to search for the desired fixed point, the low-frequency component superimposed to the clock reference terminal C is increased. However, there are limits to the amount of phase shift realized by varying the voltage applied to the clock reference terminal C, and it is difficult to secure a large amount of phase shift.

SUMMARY OF THE INVENTION

Accordingly, it is an object of the present invention to eliminate the above-described problems in the related art and to provide a timing circuit which is capable of stably operating even if the input waveform of a data signal has a large distortion and the duty of the data signal greatly changes.

It is another object of the present invention to provide a timing circuit which is capable of maintaining the duty of a data signal at 100% even if the data signal has a distortion.

It is still another object of the present invention to provide a timing circuit having a simple structure which is capable of accurately operating even if the duty of a data signal changes.

To achieve these ends, in a first aspect of the present invention, there is provided a timing circuit for generating a clock signal which indicates a timing for discriminating a data signal. The timing circuit comprises a branching means for branching a data signal in two directions, a duty monitoring means for monitoring the duty of a first data signal output from the branching means, and a duty varying means for varying the duty of a second data signal output from the branching means. The timing circuit further comprises a control circuit for controlling the duty varying means on the basis of the duty information output from the duty monitoring means so that the duty of the data signal to be output has a predetermined value, and a clock signal generating means for generating a clock signal which is synchronous with the data signal output from the duty varying means and indicating timing for discriminating the data signal.

In a second aspect of the present invention, there is provided a timing circuit for generating a clock signal which indicates a timing for discriminating a data signal, wherein the timing circuit comprises a duty varying means for varying the duty of a data signal, a duty monitoring means for monitoring the duty of a data signal output from the duty varying means, a control circuit for controlling the duty varying means so that the duty of the data signal output from the duty monitoring means has a predetermined value. The timing circuit further comprises a clock signal generating means for generating a clock signal which is synchronous with the data signal output from the duty monitoring means and indicates a timing for discriminating the data signal.

In a third aspect of the present invention, there is provided a timing circuit for generating a clock signal which indicates a timing for discriminating a data signal, the timing circuit comprises a duty varying means for varying the duty of a data signal, a clock component detector for detecting the magnitude of a clock component extract from the data signal which is output from the duty varying means, and a control circuit for controlling the duty varying means so that the extracted clock component is at its maximum. The timing circuit further comprises a clock signal generating means for generating a clock signal which is synchronous with the data signal output from the duty varying means and indicates a timing for discriminating the data signal.

Other features and advantages of the present invention will be apparent from the following description taken in conjunction with the accompanying drawings.

BRIEF DESCRIPTION OF THE DRAWINGS

FIGS. 7A and 7B are explanatory views of the dependence of an output waveform on the reference level;

FIG. 25 is a time chart of phase detection by a D-FF;

FIG. 30 is an explanatory view of the output of a phase detector when the duty of a data signal changes.

Figure 1:
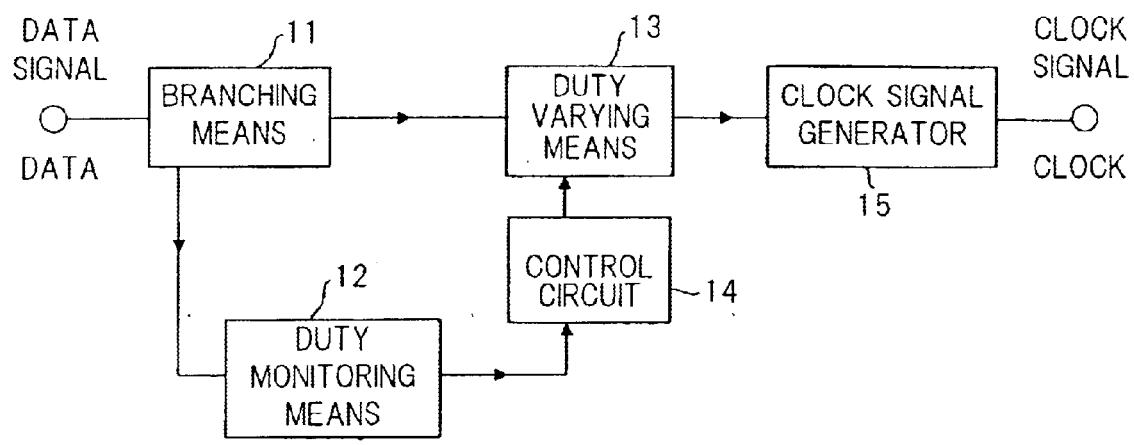
FIG. 1 is an explanatory view of a first principle of the present invention.

DESCRIPTION OF THE PREFERRED EMBODIMENTS (A) The Outline of the Invention
(a) First Timing Circuit According to the Present Invention FIG. 1 is an explanatory view of the principle of a first timing circuit according to the present invention. The timing circuit maintains the duty of a data signal at 100% by feed-forward control. In FIG. 1, the reference numeral 11 represents a branching means for branching a data signal DATA in two directions, 12 a duty monitoring means for monitoring the duty of a first data signal output from the branching means 11, 13 a duty varying means for varying the duty of a second data signal output from the branching means 11, 14 a control circuit for controlling the duty varying means 13 on the basis of the duty information output from the duty monitoring means 12 so that the duty of the data signal to be output has a predetermined value (e.g., 100%); and 15 a clock signal generator for generating a clock signal for discriminating a data signal which is synchronous with the data signal output from the duty varying means 13.

More specifically, the duty monitoring means 12 is composed of an averaging circuit for outputting the average value (average level) of the data signal as duty information. The duty varying means 13 is composed of an amplifier provided with a signal input terminal and a reference terminal to which is supplied a reference signal for specifying the amplification center level of an input signal. The duty varying means 13 inputs a data signal as the input signal to the signal input terminal and inputs a reference signal which is output from the control circuit 14 to the reference terminal, and varies the duty of the data signal output from the amplifier. The clock signal generator 15 is composed of the conventional timing circuit using a timing filter shown in FIG. 20, or the conventional timing circuit using a PLL shown in FIG. 21.

According to this structure, it is possible to maintain the duty of the data signal to be output at 100% by feed-forward control by a simple structure, and therefore stably generate a clock signal for discriminating the data signal even if the input waveform has a large distortion and the duty greatly changes.

In this case, if an amplifier having a signal input terminal and a reference terminal built-in one (e.g., EXOR circuit) of the digital circuits in the clock signal generator 15 is provided with the function of the duty varying means, the duty varying means 13 is dispensed with, thereby simplifying the circuit structure.

(b) Second Timing Circuit According to the Present Invention

Figure 2:
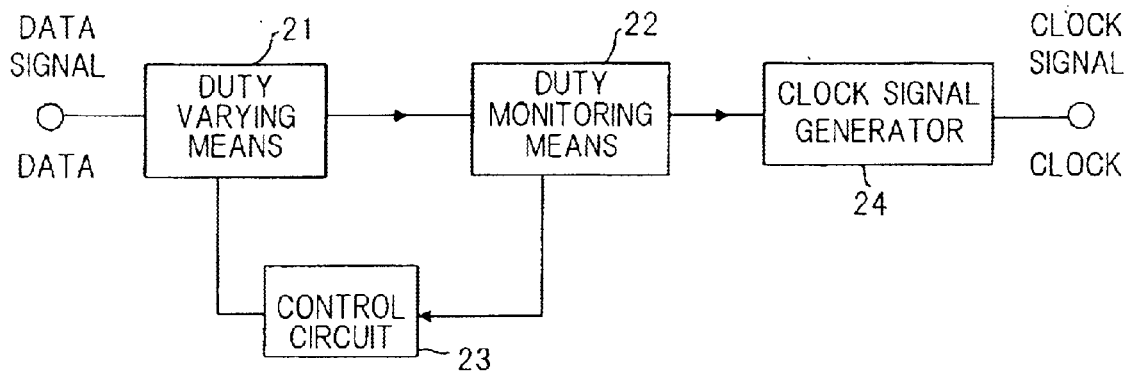
FIG. 2 is an explanatory view of a second principle of the present invention.

FIG. 2 is an explanatory view of the principle of a second timing circuit according to the present invention. The timing circuit maintains the duty of a data signal at 100% by feedback control. In FIG. 2, the reference numeral 21 represents a duty varying means for varying the duty of a data signal, 22 a duty monitoring means for monitoring the duty of the data signal output from the duty varying means 21, 23 a control circuit for controlling the duty varying means 21 so that the duty of the data signal output from the duty monitoring means 22 has a predetermined value (e.g., 100%); and 24 a clock signal generator for generating a clock signal for discriminating a data signal which is synchronous with the data signal output from the duty monitoring means 22.

More specifically, the duty monitoring means 22 is composed of an averaging circuit for outputting the average value of the data signal as duty information. The duty varying means 21 is composed of an amplifier provided with a signal input terminal and a reference terminal to which is supplied a reference signal for specifying the amplification center level of an input signal. The duty varying means 21 inputs a data signal to the signal input terminal as the input signal and inputs a reference signal which is output from the control circuit 23 to the reference terminal, and varies the duty of the data signal output from the amplifier. The clock signal generator 24 is composed of the conventional timing circuit using a timing filter shown in FIG. 20, or the conventional timing circuit using a PLL shown in FIG. 21.

According to this structure, it is possible to maintain the duty of the data signal to be output at 100% by feedback control by a simple structure, and therefore stably generate a clock signal for discriminating the data signal even if the input waveform has a large distortion and the duty greatly changes.

The duty varying means 21 can be constituted by a differential amplifier for outputting a non-inverting signal and an inverting signal which correspond to the difference between the data signal and the reference signal respectively input to the signal input terminal and the reference terminal, and the control circuit 23 varies the duty by controlling the level of the reference signal of the difference amplifier so that the average values of the non-inverting signal and the inverting signal coincide with each other. In this manner, if the duty varying means 21 is constituted by a differential amplifier, it is not necessary to obtain the reference value in advance and store it, so that the structure is simplified.

(c) Third Timing Circuit According to the Present Invention

Figure 3:
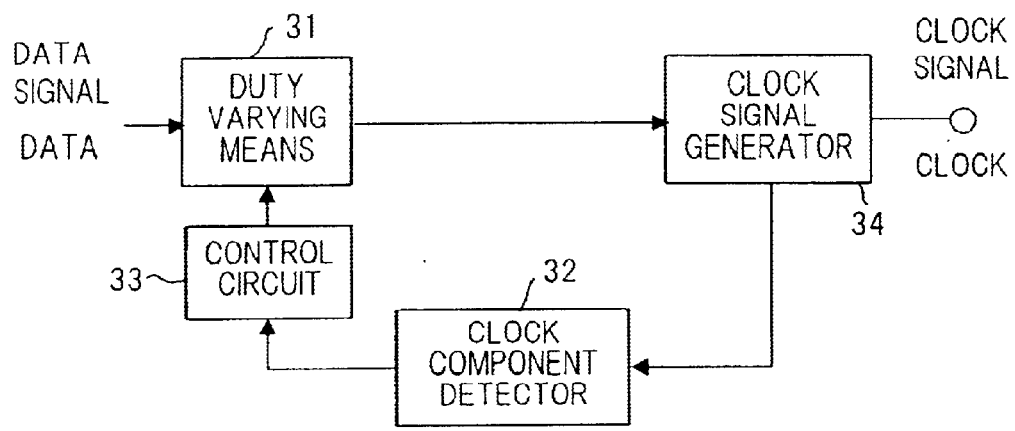
FIG. 3 is an explanatory view of a third principle of the present invention.

FIG. 3 is an explanatory view of the principle of a third timing circuit according to the present invention. The timing circuit maintains the duty of a data signal at 100% by executing feedback control so that the clock component is at its maximum. In FIG. 3, the reference numeral 31 represents a duty varying means for varying the duty of a data signal DATA, 32 a clock component detector for detecting the magnitude of the clock component nonlinearly extracted from the data signal which is output from the duty varying means 31; 33 a control circuit for controlling the duty varying means 31 so that the extracted clock component is at its maximum; and 34 a clock signal generator for generating a clock signal for discriminating a data signal which is synchronous with the data signal output from the duty varying means 31.

More specifically, the duty varying means 31 is composed of an amplifier provided with a signal input terminal and a reference terminal to which is supplied a reference signal for specifying the amplification center level of an input signal. The duty varying means 31 inputs the data signal DATA to the signal input terminal as the input signal and inputs a reference signal which is output from the control circuit 33 to the reference terminal, and varies the duty of the data signal output from the amplifier. The control circuit 33 is provided with (1) an oscillator for generating a low-frequency signal, (2) a reference signal generator for generating a reference signal so that the clock component is at its maximum, and (3) a means for superimposing the low-frequency signal on the reference signal and inputting it to the reference terminal of the duty varying means (amplifier) 31. The duty varying means (amplifier) 31 outputs a data signal with the duty provided with perturbation at a low frequency, and the clock component detector 32 detects the magnitude of the clock component from the signal output from the duty varying means 31. The clock signal generator 34 is composed of the conventional timing circuit using a timing filter shown in FIG. 20.

According to this structure, it is possible to maintain the duty of the data signal to be ouput at 100% by feedback control by a simple structure, and therefore stably generate a clock signal for discriminating the data signal even if the input waveform has a large distortion and the duty greatly changes.

If an amplifier having a signal input terminal and a reference terminal built-in one (e.g., EXOR circuit) of the digital circuits in the clock signal generator 34 is provide with the function of the duty varying means, the duty varying means 31 is dispensed with, thereby simplifying the circuit structure.

(B) First Embodiment (a) Structure

Figure 4:
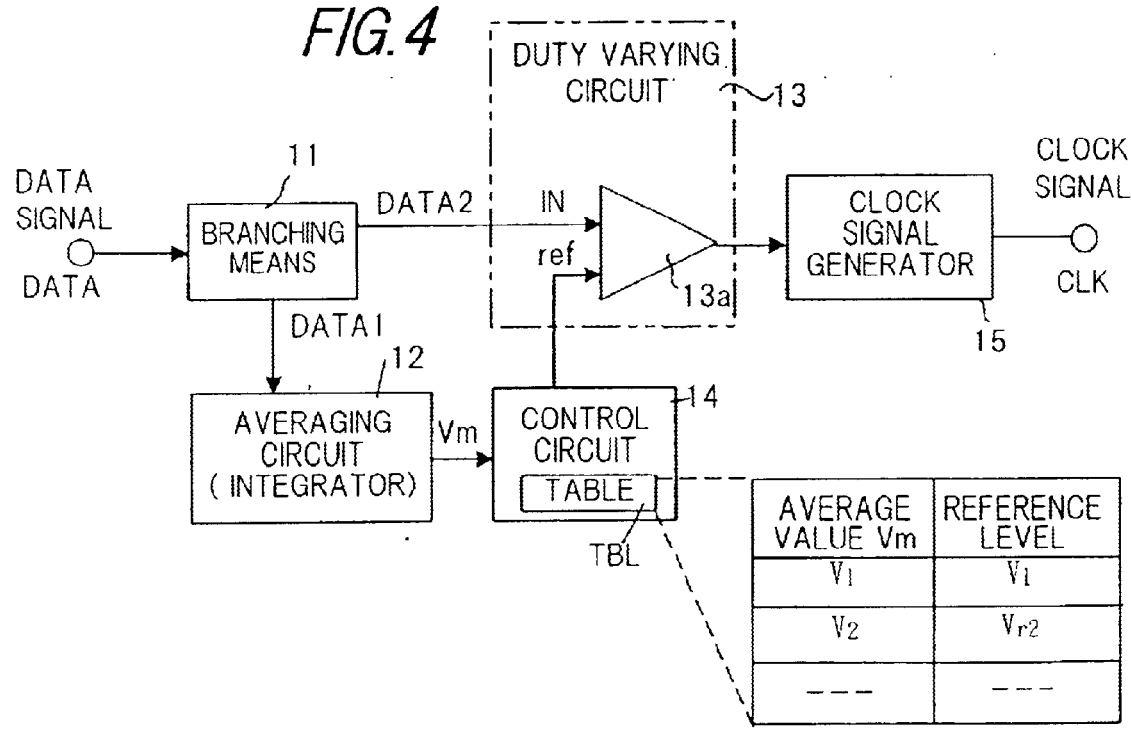
FIG. 4 shows a first embodiment of the present invention.
Figure 5:
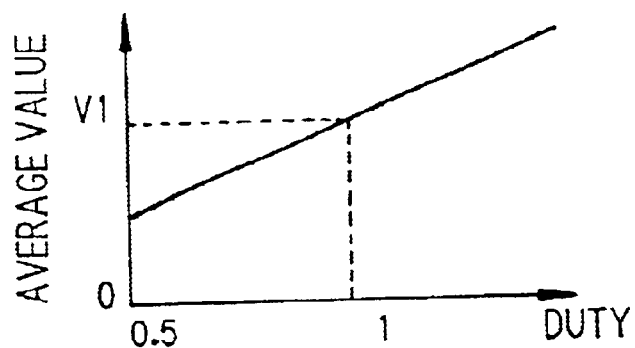
FIG. 5 is an explanatory view of the relationship between the duty of a waveform and the average value.

FIG. 4 shows the structure of a first embodiment of a timing circuit according to the present invention. The timing circuit has a structure for maintaining the duty of a data signal at 100% by feed-forward control. In FIG. 4, the reference number 11 represents a branching circuit for branching a data signal DATA in two directions, 12 an averaging circuit as a duty monitoring means for monitoring the duty of a first data signal DATA1 output from the branching circuit 11. The averaging circuit 12 is composed of, for example, an integrator circuit which obtains the average value of the first data signal DATA1 output from the branching circuit 11 and outputs the average value as duty information. In the data signal DATA, the number of "1"s and the number of "0"s are made equal by scrambling processing. Therefore, the average value output from the averaging circuit 12 is proportional to the duty of the data signal, as shown in FIG. 5. In other words, the average value contains the duty information of the data signal.

Figure 6A:
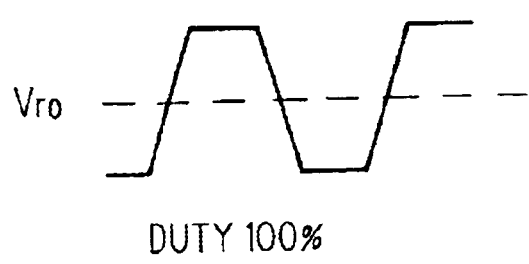
FIGS. 6A and 6B are explanatory views of the relationship between the duty of a data signal and the reference level.
Figure 6B:
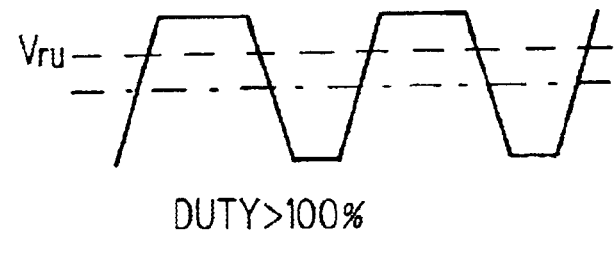

The reference numeral 13 represents a duty varying circuit for varying the duty of a second data signal DATA2 output from the branching circuit 11. The duty varying circuit 13 is composed of an amplifier 13a provided with a signal input terminal IN and a reference terminal ref to which is supplied a reference signal for specifying the amplification center level. It is possible to vary the duty of the data signal output from the amplifier 13a by inputting the data signal to the signal input terminal IN and a reference signal to the reference terminal ref and controlling the level of the reference signal. For example, when the duty of the data signal DATA is 100%, as shown in FIG. 6A, the reference level is set at Vr0, which is the center level of the data signal. When the duty is more than 100%, as shown in FIG. 6B, the reference level is set at Vru, which is larger than the center level Vr0 of the data signal. When the duty is less than 100% (not shown), the reference level is set at a value smaller than Vr0, which is the center level of the data signal.

FIG. 7 is an explanatory view of the dependence of the waveform output from the amplifier 13a on the reference level. FIG. 7A shows the output waveform when the duty of the data signal input to the amplifier 13a is more than 100% and the reference level is set at Vr0, which is the center level of the data signal. The data signal input to the amplifier 13a is amplified with the reference level Vr0 as the center, and the waveform is cut at the saturation level on the positive and negative sides. The output waveform has a duty of more than 100%, as shown on the right side. FIG. 7B shows the output waveform when the duty of the data signal input to the amplifier 13a is more than 100% and the reference level is set at Vru, which is larger than the center level of the data signal. The data signal input to the amplifier 13a is amplified with the reference level Vru as the center, and the waveform is cut at the saturation level on the positive and negative sides. The output waveform has a duty of 100%, as shown on the right side. In this manner, even if the duty of the data signal DATA is not 100%, it is possible to maintain the duty of the output signal at 100% by controlling the reference level of the amplifier 13a.

Returning to FIG. 4, the reference numeral 14 represents a control circuit, which determines the reference level of the amplifier 13a so that the duty of the data signal output from the amplifier 13a is 100%, and inputs a reference signal to the reference terminal ref. Since the duty of the input data signal is proportional to the average value Vm of the data signal, the reference levels are measured in advance in correspondence with various average values (duties) so that the duty of the data signal output from the amplifier 13a may be 100%, and the correspondence is set in a table TBL. The control circuit 14 is thus capable of determining the reference level so that the duty of the output waveform may be 100% in correspondence with the average value Vm by reference to the table TBL and inputting the reference level to the reference terminal of the amplifier 13a.

The reference numeral 15 represents a clock signal generator for generating a clock signal CLK for discriminating a data signal which is synchronous with the data signal output from the amplifier 13a. The clock signal generator 15 is composed of the conventional timing circuit using a timing filter shown in FIG. 20, or the conventional timing circuit using a PLL shown in FIG. 21.

(b) Operation

Figure 19:
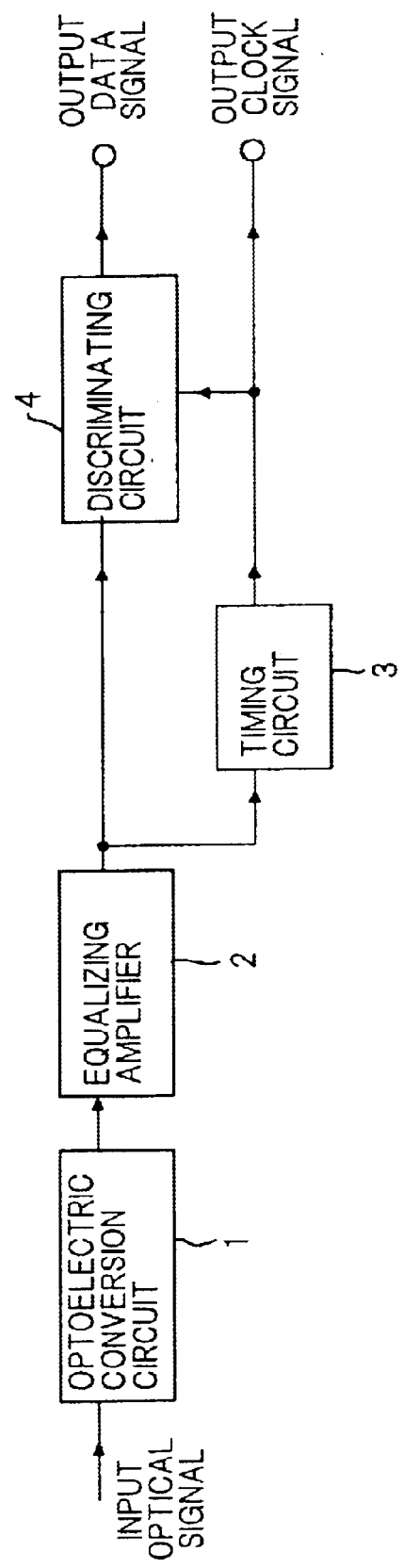
FIG. 19 is a block diagram of an optical receiver.

In the first embodiment, the branching circuit 11 branches the input data signal DATA in two directions and inputs them to the averaging circuit 12 and the amplifier 13a of the duty varying circuit 13. The averaging circuit 12 calculates the average value Vm of the data signal and inputs it to the control circuit 14. The control circuit 14 obtains the reference level corresponding to the input average value Vm by reference to the table TBL, generates the reference signal having the reference level and inputs it to the reference terminal ref of the amplifier 13a. The amplifier 13a amplifies the input signal with the reference level as the center, and inputs the data signal having the waveform of duty 100% to the clock signal generator 15. The clock signal generator 15 generates a clock signal CLK for discriminating a data signal which is synchronous with the data signal, and inputs the clock signal to the discriminating circuit (not shown) of an optical receiver such as that shown in FIG. 19.

As described above, according to the first embodiment, it is possible to maintain the duty of a data signal at 100% by a simple structure and inputting it to the clock signal generator 15. Consequently, it is possible to stably generate a clock signal for discriminating the data signal even if the input waveform has a large distortion and the duty greatly changes, and a discriminating circuit is capable of accurately discriminating the input data signal and reproducing it.

(c) First Modification

In the first embodiment, the amplifier 13a is specially provided as the duty varying means 13. However, among the digital circuits of the clock signal generator 15, there is one provided with a signal input terminal and a reference terminal such as an EXOR circuit. The amplifier built in the EXOR circuit can be substituted for the amplifier 13a of the duty varying means 13 in the first embodiment.

Figure 8:
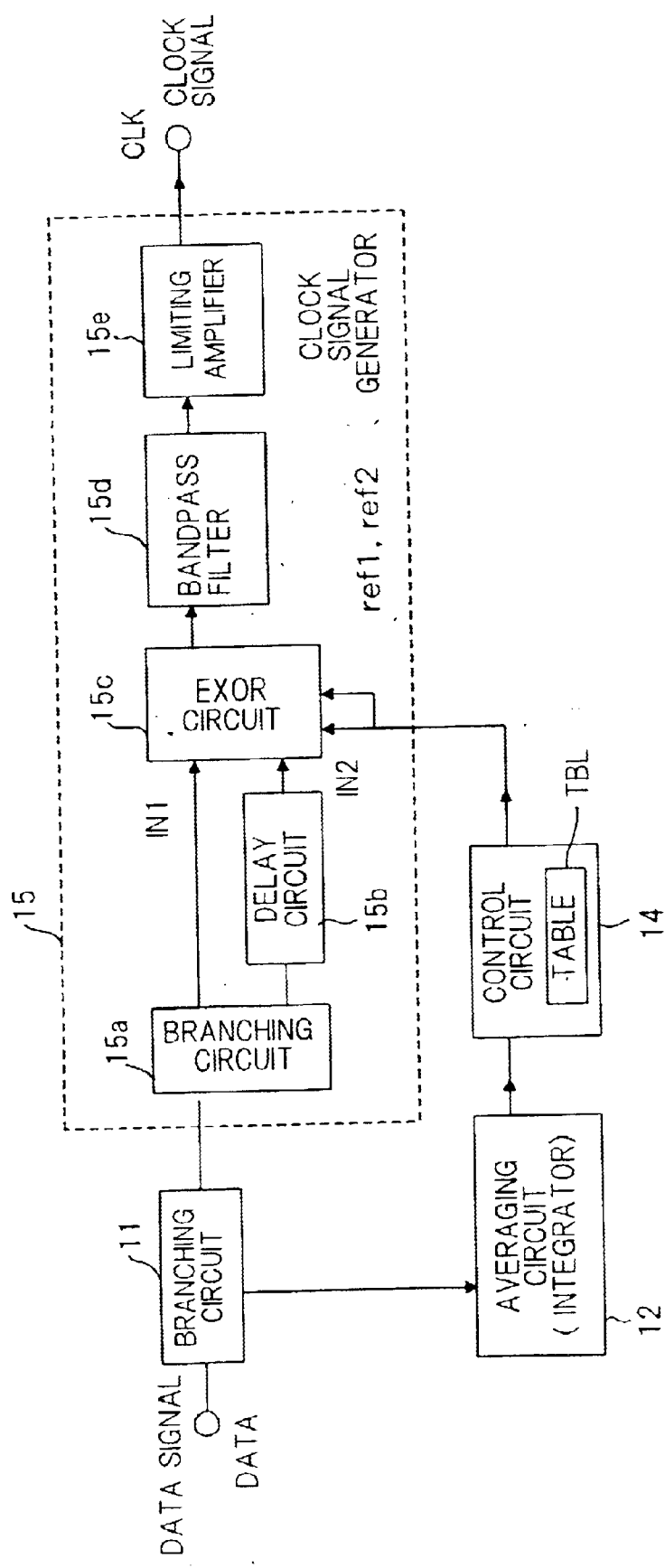
FIG. 8 shows a first modification of the first embodiment of the present invention.

FIG. 8 shows the structure of a first modification of the first embodiment of a timing circuit according to the present invention. The same reference numerals are provided for the elements which are the same as those in the first embodiment shown in FIG. 4. The reference numeral 11 represents a branching circuit, 12 an averaging circuit, 14 a control circuit and 15 a clock signal generator.

Figure 20:
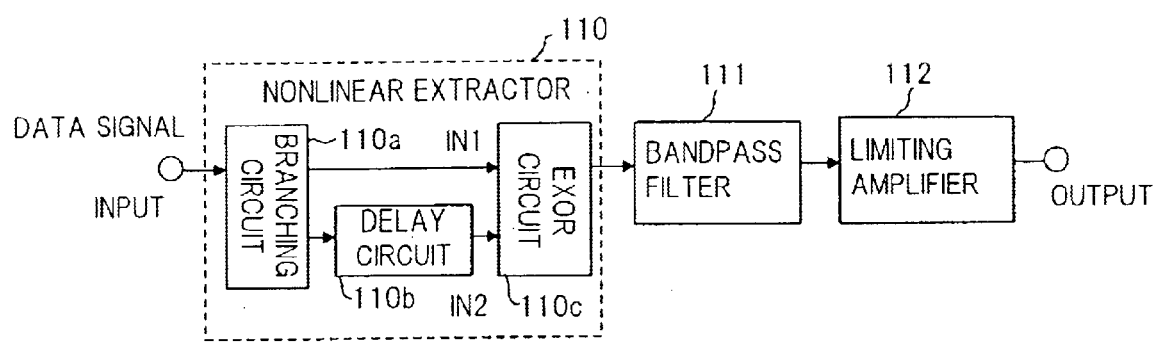
FIG. 20 shows the structure of a conventional timing circuit using a timing filter.

The clock signal generator 15 has the same structure as the timing circuit shown in FIG. 20. The clock signal generator 15 is composed of a branching circuit 15a for branching an input data signal in two directions, a delay circuit 15b for delaying the first branched data signal by a predetermined time, an EXOR circuit 15c for executing an exclusive OR operation of the second branched data signal and the output signal of the delay circuit 15b and generating an edge signal having a pulse at the rising edge and the falling edge of the data signal, a bandpass filter 15d for extracting a clock component having the same frequency as the bit rate of the data signal from the output of the EXOR circuit 15c and outputting the extracted clock component, and a limiting amplifier 15e for amplifying a clock component to a predetermined amplitude.

Figure 9:
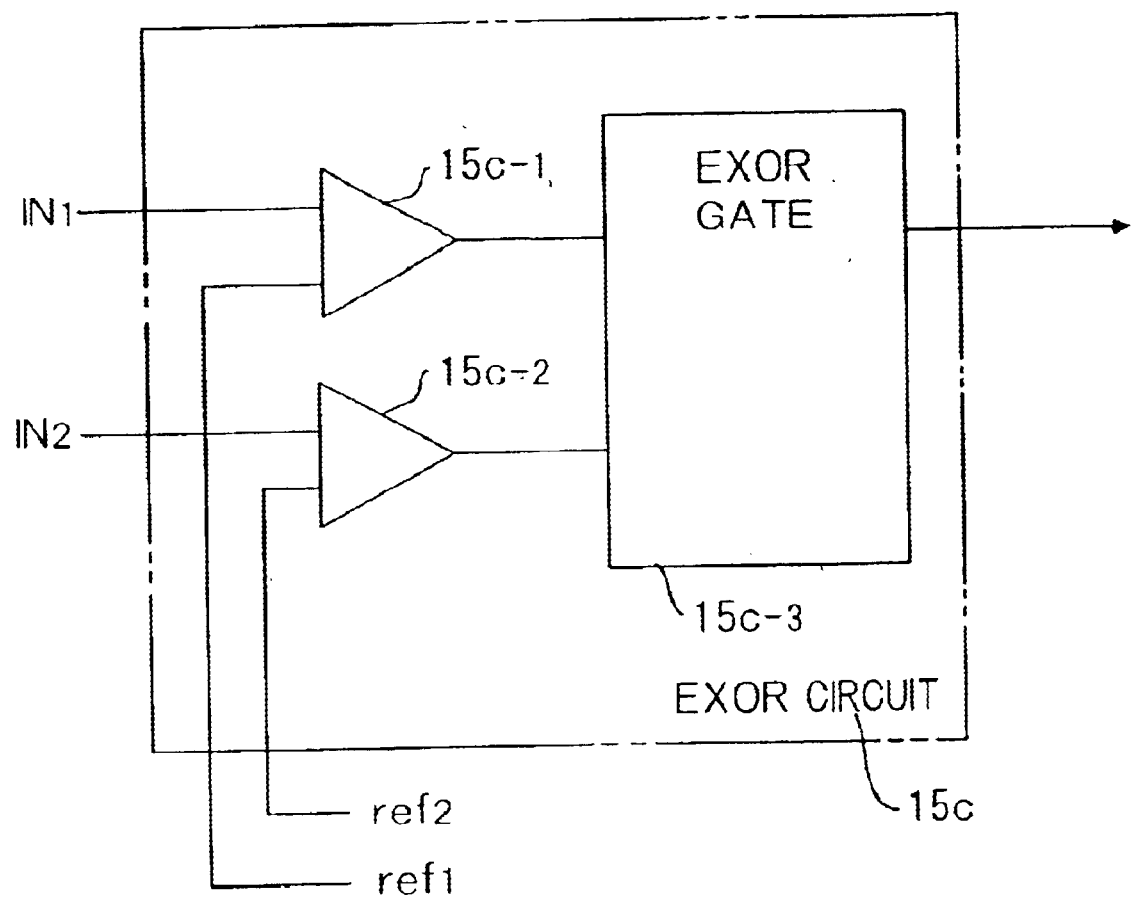
FIG. 9 shows the structure of an EXOR circuit.

The EXOR circuit 15c is composed of a digital IC, and is provided with two amplifiers 15c-1, 15c-2, and an EXOR gate 15c-3, as shown in FIG. 9. Each of the amplifiers 15c-1, 15c-2 has a signal input terminal IN1 (IN2) and a reference terminal ref1 (ref2), and amplifies the input signal with the reference level as the center. In other words, each of the amplifiers 15c-1, 15c-2 is capable of varying the duty of an output signal by varying the reference level.

Therefore, the reference levels are measured in advance in correspondence with various average values (duties) of a data signal so that the duties of the waveforms output from the amplifiers 15c-1, 15c-2 may be 100%, and the correspondence is set in a table TBL. The control circuit 14 is thus capable of determining the respective reference levels so that the duties of the waveforms output from the amplifiers 15c-1, 15c-2 may be 100% by reference to the table TBL and inputting the reference levels to the reference terminals ref1, ref2 of the amplifiers 15c-1 and 15c-2, respectively.

According to the modification, it is possible to substitute the amplifier built in the digital circuit (e.g., EXOR circuit) which constitutes the clock signal generator 15 for the duty varying means. It is therefore possible to dispense with the amplifier 13a as the duty varying means in the first embodiment, thereby simplifying the circuit structure.

(c) Second Modification

Figure 10:
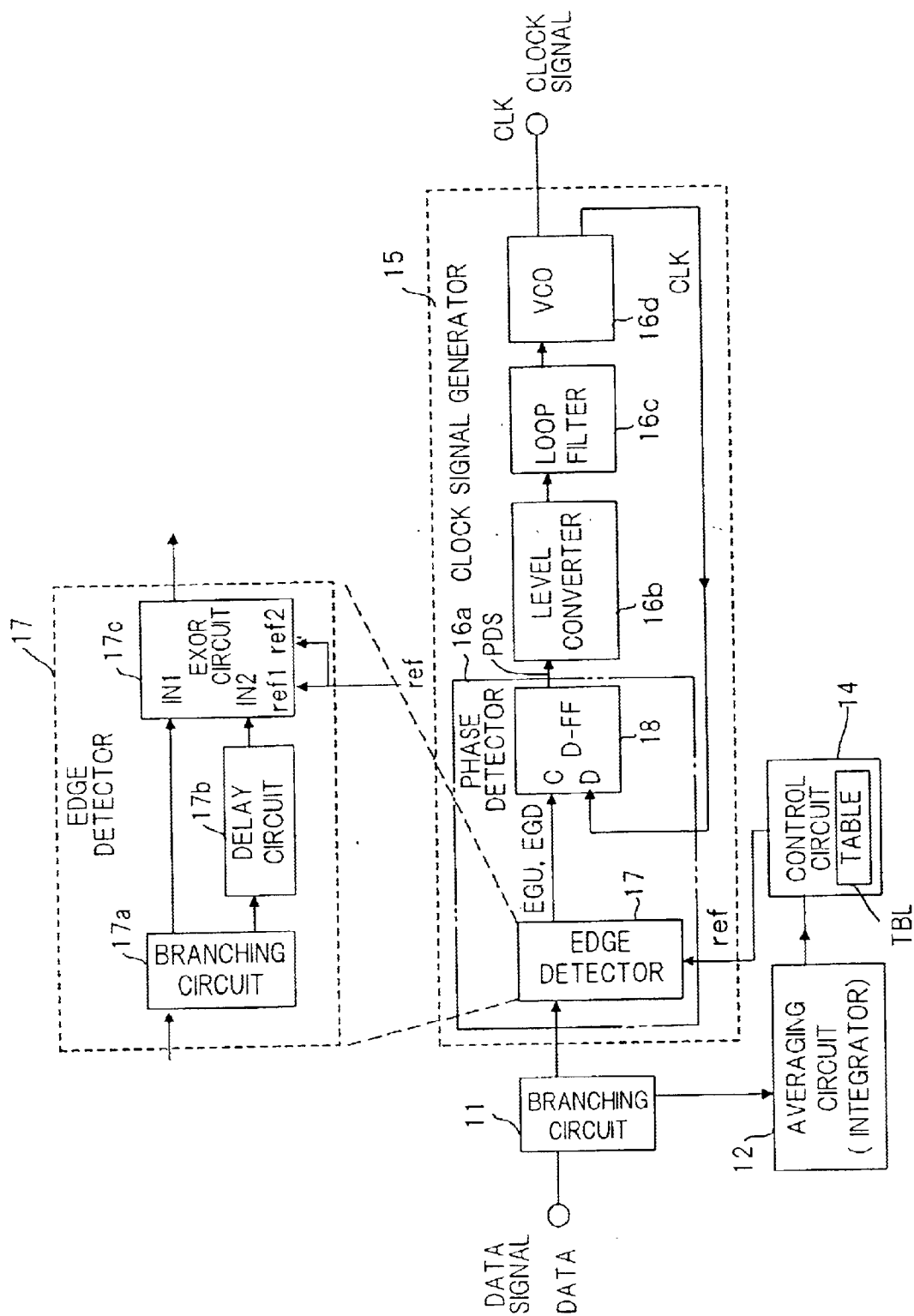
FIG. 10 shows a second modification of the first embodiment of the present invention.

FIG. 10 shows a second modification of the first embodiment based on the same principle as the first modification. In the second modification, the clock signal generator is constituted by a PLL. The same reference numerals are provided for the elements which are the same as those shown in FIG. 4. The reference numeral represents a branching circuit, 12 an averaging circuit, 14 a control circuit and 15 a clock signal generator.

Figure 21:
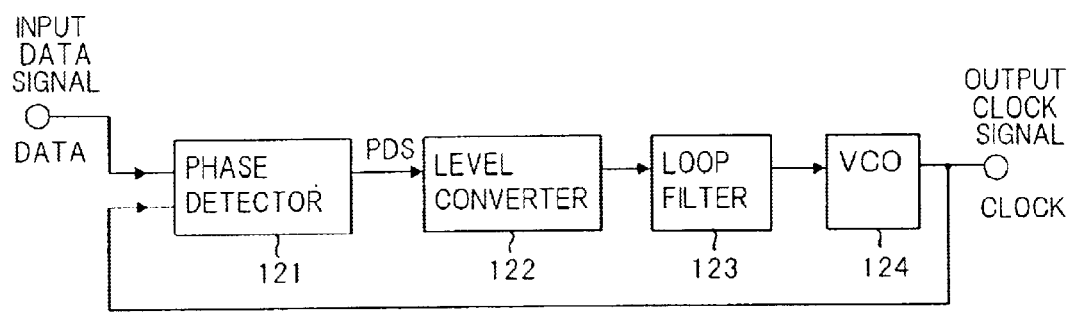
FIG. 21 shows the structure of a conventional timing circuit using a PLL.
Figure 22:
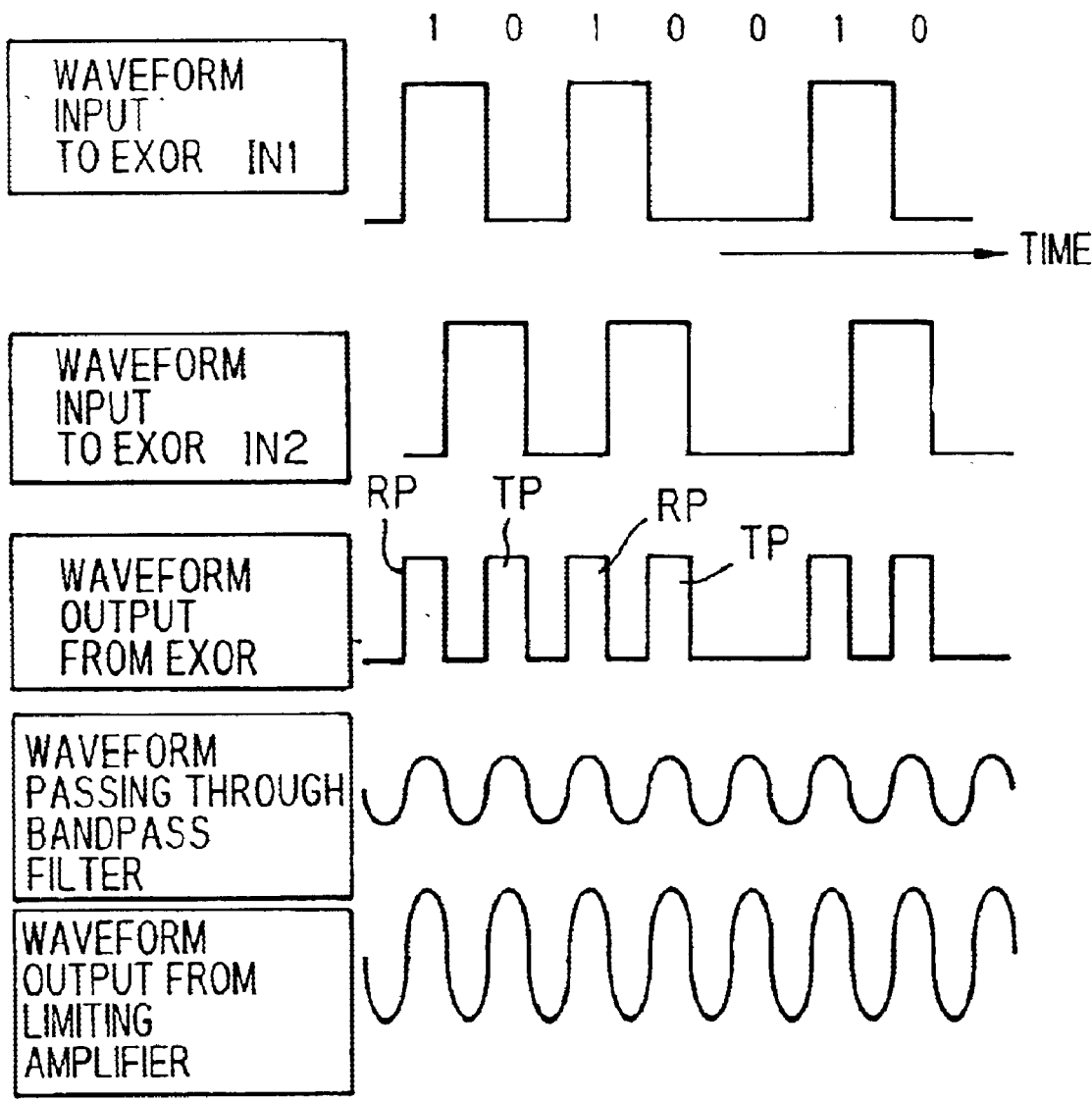
FIG. 22 shows a waveform for explaining the operation of the timing circuit using a timing filter.
Figure 23:
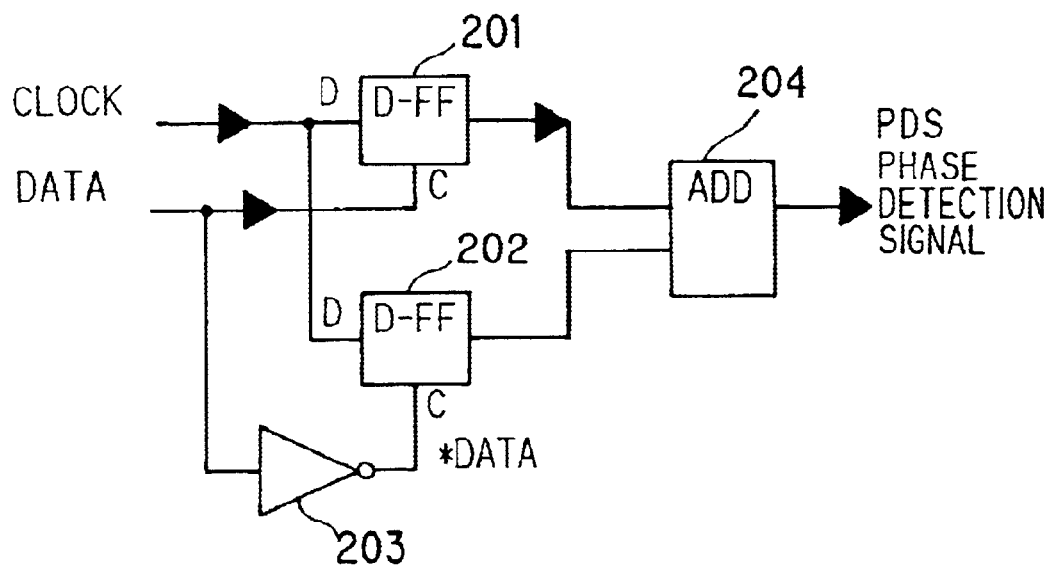
FIG. 23 shows a phase detector.
Figure 24:
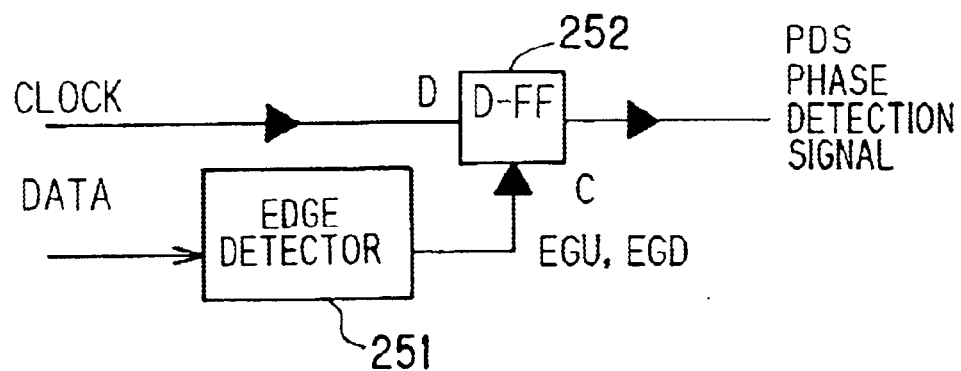
FIG. 24 shows another phase detector.
Figure 26:
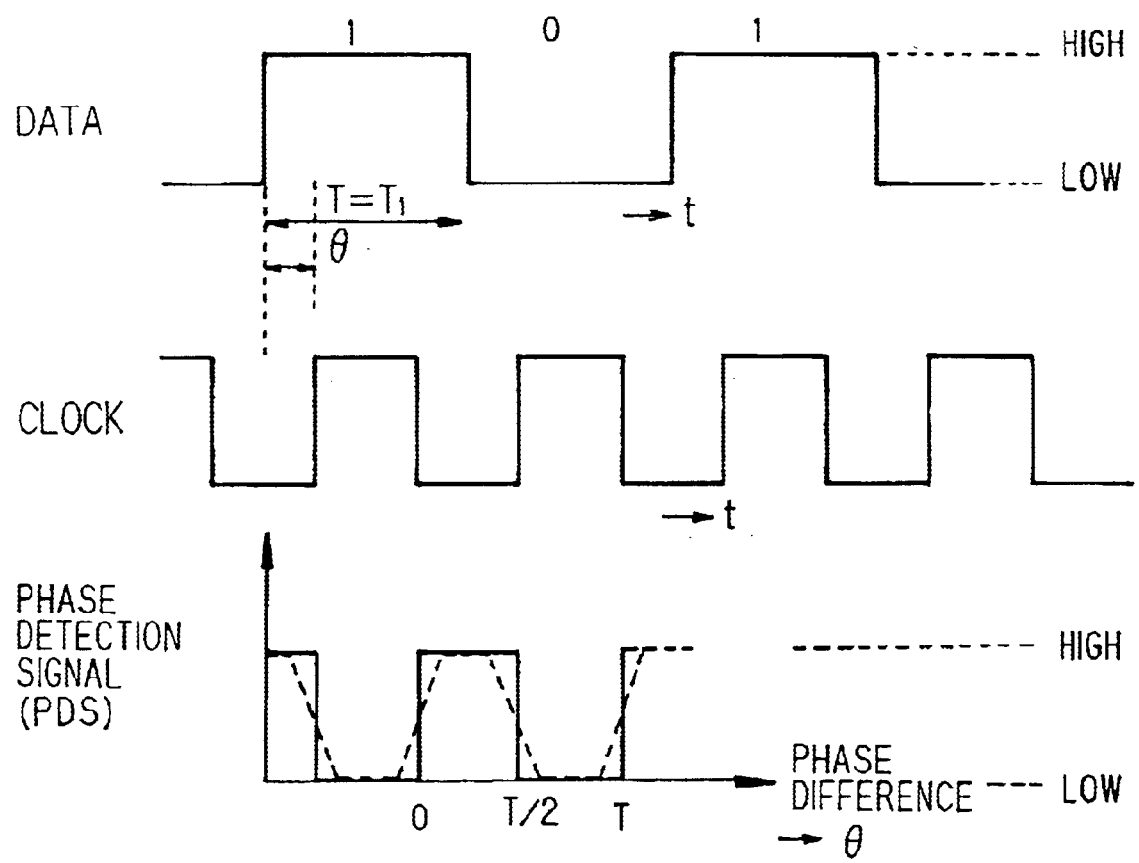
FIG. 26 is an explanatory view of the relationship between a phase difference between a clock signal and a data signal and the output of a phase detector.
Figure 27A:
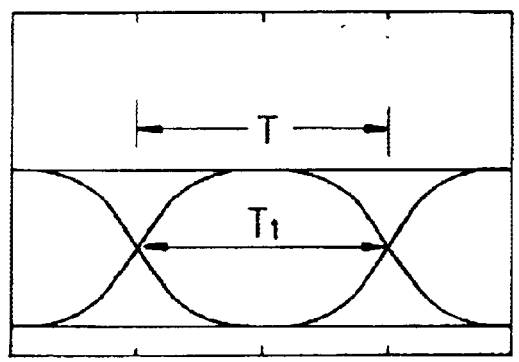
FIGS. 27A, 27B and 27C show the waveforms of transmission light.
Figure 27B:
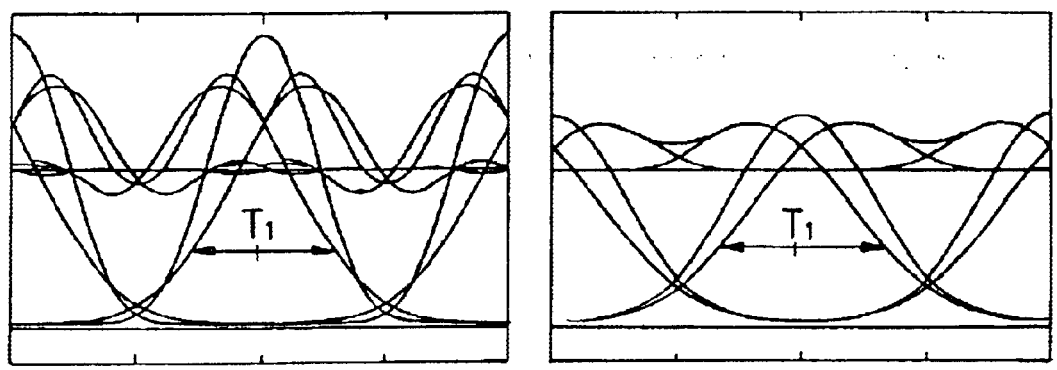
Figure 27C:
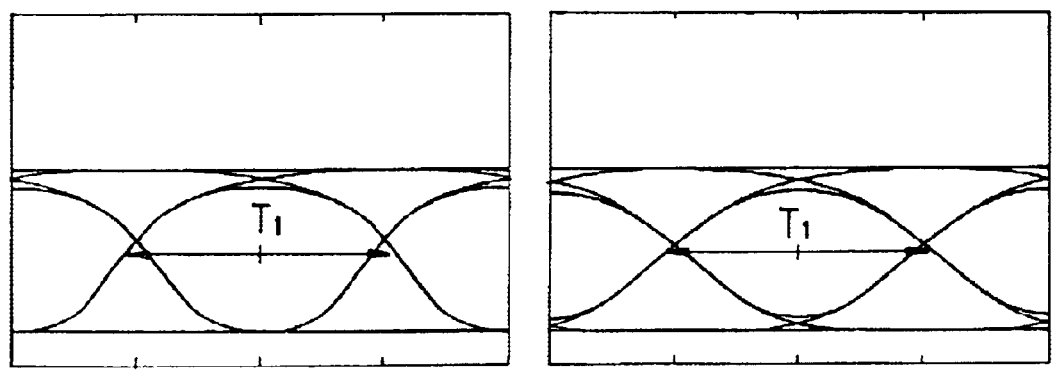
Figure 28A:
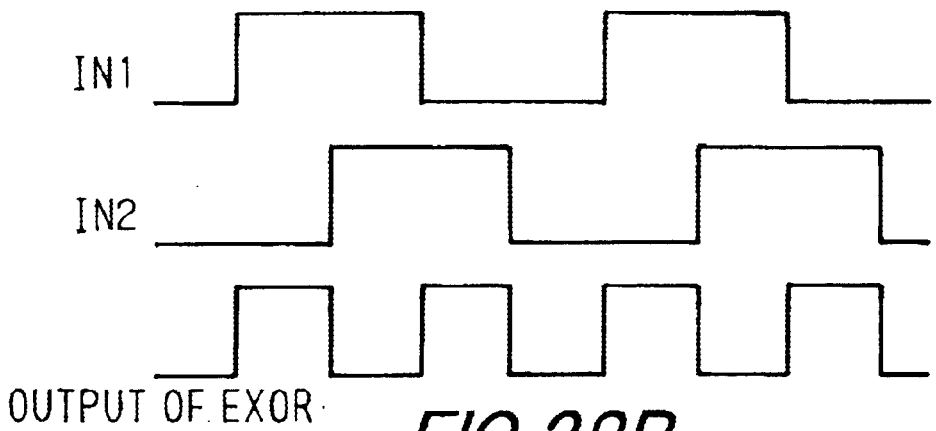
FIGS. 28A, 28B and 28C are explanatory views of the relationship between the duty of a data signal and the output of an EXOR.
Figure 28B:
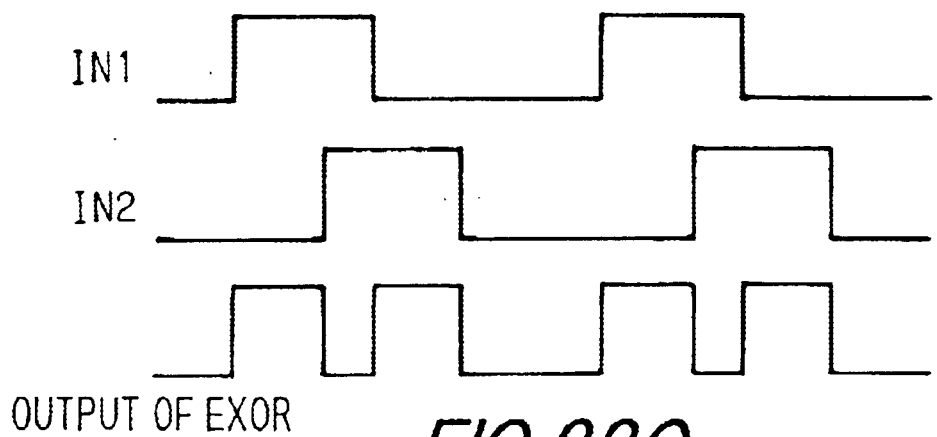
Figure 28C:
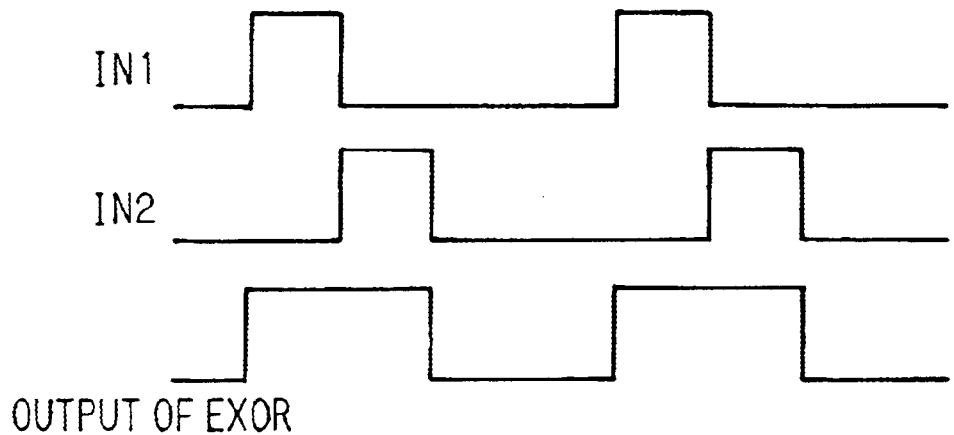

The clock signal generator 15 has the same structure as the timing circuit shown in FIG. 21, and a phase detector of the timing circuit has the structure shown in FIG. 24. That is, the clock signal generator 15 is provided with a phase detector 16a for comparing the phases of a data signal and a clock signal, a level converter 16b for converting the output level of the phase detector 16a, a loop filter 16c for smoothing the voltage signal corresponding to the phase difference which is output from the level converter 16b, and a voltage controlled oscillator (VCO) 16d for generating a clock signal having the frequency corresponding to the output of the loop filter 16c.

The phase detector 16a detects the rising edge and the falling edge of the data signal DATA input from the branching circuit 11 and compares the phase of the data signal with the phase of a clock signal both at the rising edge EGU and the falling edge EGD of the data signal. The phase detector 16a is constituted by an edge detector 17 and a D flip flop (D-FF) 18. The D-FF 18 outputs the level (low level/high level) of the clock signal CLK generated at the rising edge EGU and the falling edge EGD as a phase detection signal, and the clock signal generator 15 having a PLL structure controls the phase detection signal PDS to a preset level.

The edge detector 17 is provided with a branching circuit 17a for branching an input data signal in two directions, a delay circuit 17b for delaying the first branched data signal by a predetermined time, and an EXOR circuit 17c for executing an exclusive OR operation of the second branched data signal and the output signal of the delay circuit 17b and generating an edge signal having a pulse at the rising edge and the falling edge of the data signal. The EXOR circuit 17c has the structure shown in FIG. 9. Accordingly, it is possible to vary the duty of a signal output from the amplifier built in the EXOR circuit 17c by varying the reference level of the EXOR circuit 17c in the same way as in the first modification.

According to the second modification, it is possible to constitute the duty varying means by the amplifier built in a digital circuit (e.g., EXOR circuit) constituting the clock signal generator, in the same way as in the first modification. It is therefore possible to dispense with the amplifier 13a as the duty varying means in the first embodiment, thereby simplifying the circuit structure.

(C) Second Embodiment (a) Structure

Figure 11:
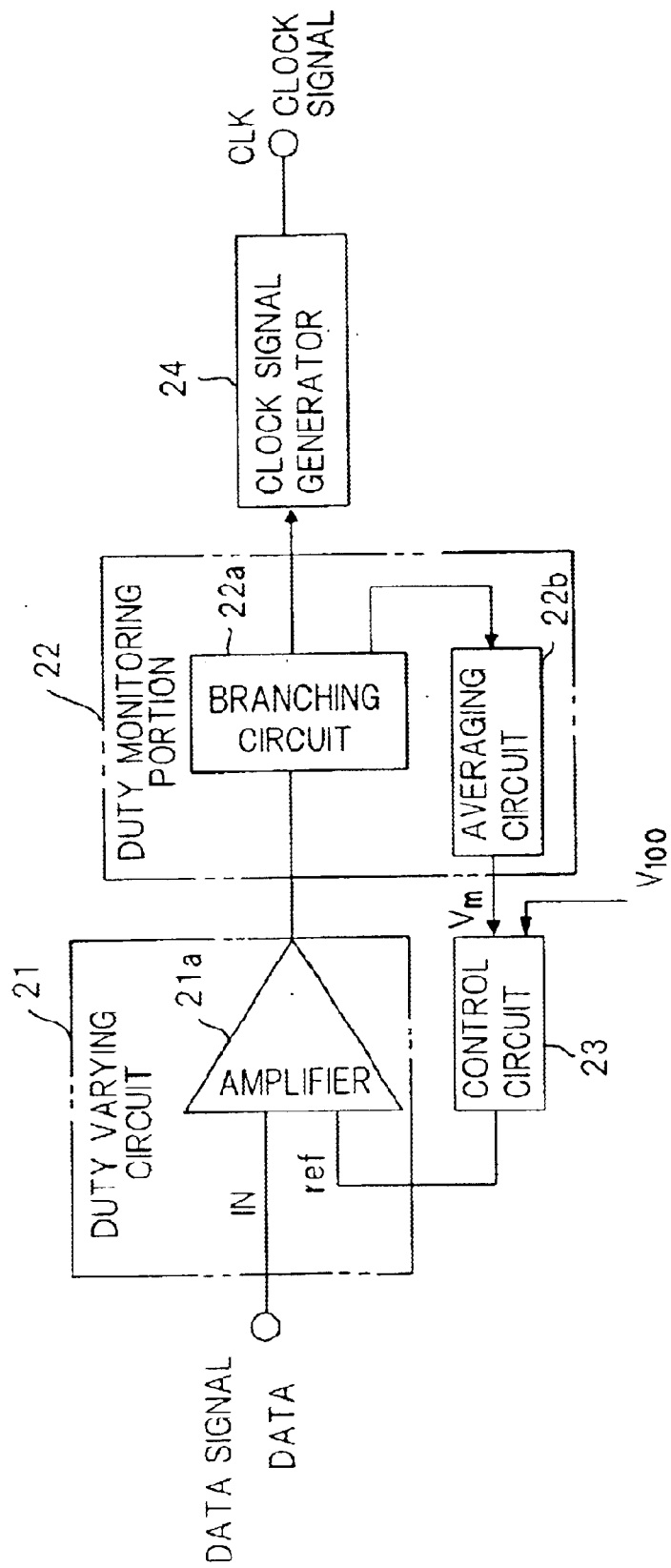
FIG. 11 shows a second embodiment of the present invention.

FIG. 11 shows the structure of a second embodiment of a timing circuit according to the present invention. The timing circuit maintains the duty of a data signal at 100% by executing feedback control. In FIG. 11, the reference numeral 21 represents a duty varying circuit for varying the duty of a data signal DATA. The duty varying circuit 21 is composed of an amplifier 21a provided with a signal input terminal IN and a reference terminal ref to which is supplied a reference signal for specifying the amplification center level. It is possible to vary the duty of the data signal output from the amplifier 21a by inputting the data signal to the signal input terminal IN and controlling the level of the reference signal input to the reference terminal ref. For example, when the duty of the data signal DATA is 100%, as shown in FIG. 6A, the reference level is set at Vr0, which is the center level of the data signal. When the duty is more than 100%, as shown in FIG. 6B, the reference level is set at Vru, which is larger than the center level Vr0 of the data signal. When the duty is less than 100% (not shown), the reference level is set at a value smaller than Vr0, which is the center level of the data signal.

The reference numeral 22 represents a duty monitoring portion for monitoring the duty of the data signal output from the amplifier 21a. The duty monitoring portion 22 is composed of a branching circuit 22a for branching a data signal output from the amplifier 21a in two directions and an averaging circuit 22b for obtaining and outputting the average value Vm of one of the branched data signals output from the branching circuit 22a. The averaging circuit 22b is composed of, for example, an integrator which obtains the average value Vm of the branched data signals output from the branching circuit 22a and outputs the average value Vm as duty information. In the data signal DATA, the number of "1"s and the number of "0"s are made equal by scrambling processing. Therefore, the average value output from the averaging circuit 22b is proportional to the duty of the data signal, as shown in FIG. 5. In other words, the average value contains the duty information of the data signal.

The reference numeral 23 denotes a control circuit which determines the reference level of the amplifier 21a so that the duty of the data signal output from the amplifier 21a is 100%, and inputs a control signal having this reference level to the reference terminal ref. The average value $V_{100}$ which corresponds to the data signal of duty 100% is measured in advance. In this manner, it is possible to determine whether the reference level is set at a large value or a small value by comparing the average value Vm with the average value $V_{100}$.

The reference numeral 24 represents a clock signal generator for generating a clock signal CLK for discriminating a data signal which is synchronous with the data signal output from the duty monitoring portion 22. The clock signal generator 24 is composed of the conventional timing circuit shown in FIG. 20, or the conventional timing circuit shown in FIG. 21.

(b) Operation

In the second embodiment, the amplifier 21a in the duty varying circuit 21 amplifiers an input signal with a predetermined reference level as the center, and outputs the amplified signal. The branching circuit 22a branches the input data signal DATA in two directions and inputs one branched data signal to the clock signal generator 24 and the other to the averaging circuit 22b. The averaging circuit 22b calculates the average value Vm of the data signal and inputs it to the control circuit 23. The control circuit 23 determines the reference level on the basis of the difference between the average values Vm and $V_{100}$, generates a control signal having the reference level and inputs it to the reference terminal ref of the amplifier 21a. The amplifier 21a amplifies the input signal with the new reference level as a center so as to bring the duty of an output signal close to 100%.

This feedback control is repeated thereafter until the amplifier 21a generates a data signal having a waveform of a duty 100% and inputs the data signal to the clock signal generator 24 via the branching circuit 22a. The clock signal generator 24 generates a clock signal CLK for discriminating a data signal which is synchronous with the data signal, and inputs the clock signal to the discriminating circuit (not shown) of an optical receiver such as that shown in FIG. 19.

As described above, according to the second embodiment, it is possible to maintain the duty of a data signal at 100% by feedback control by a simple structure and inputting it to the clock signal generator 24. Consequently, it is possible to stably generate a clock signal for discriminating a data signal even if the input waveform has a large distortion and the duty greatly changes, and a discriminating circuit is capable of accurately discriminating the input data signal and reproducing it.

(D) Third Embodiment (a) Structure

Figure 12:
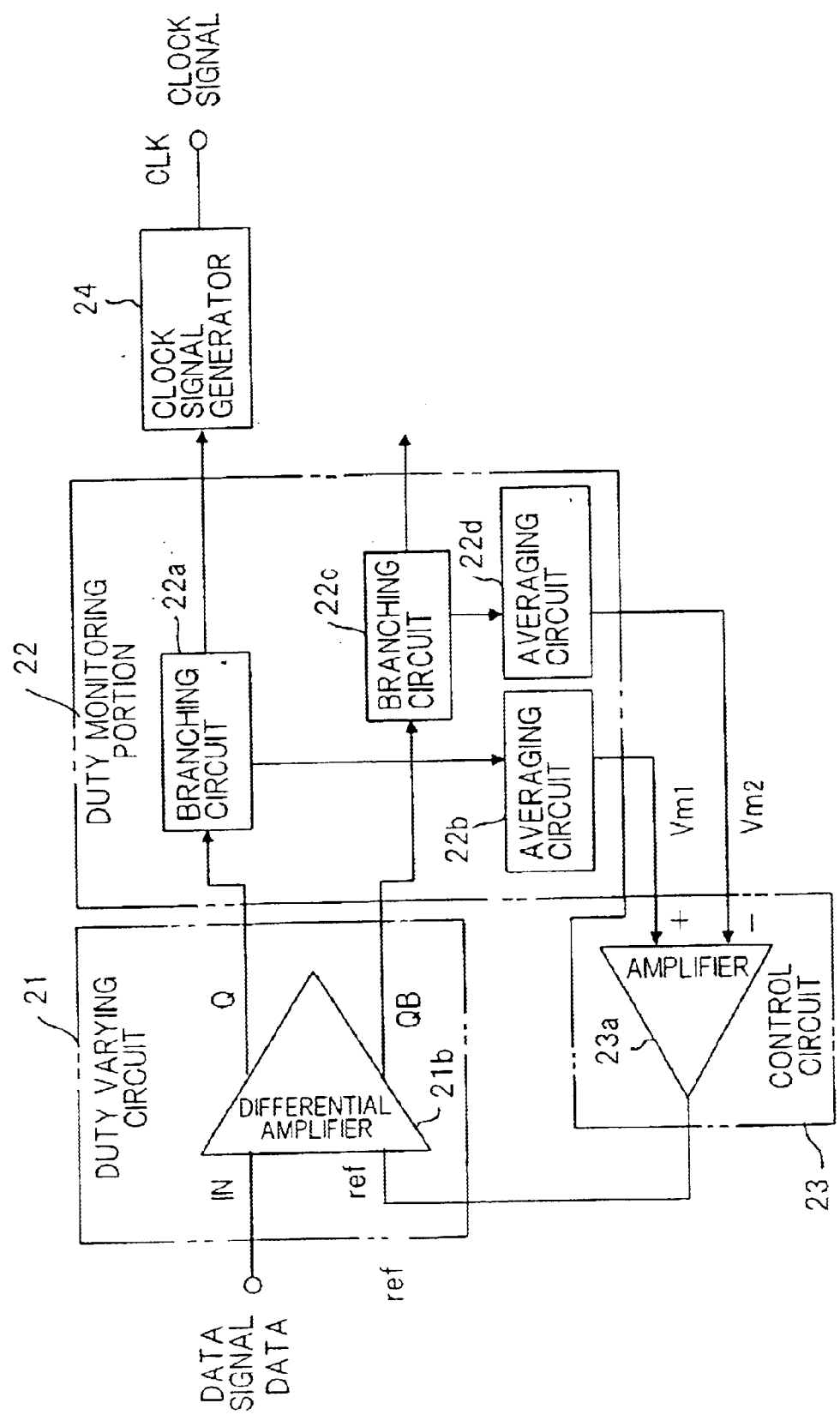
FIG. 12 shows a third embodiment of the present invention.

FIG. 12 shows the structure of a third embodiment of a timing circuit according to the present invention. The timing circuit maintains the duty of a data signal at 100% by executing feedback control in the same way as in the second embodiment. In FIG. 12, the reference numeral 21 represents a duty varying circuit for varying the duty of a data signal DATA. The duty varying circuit 21 is composed of a differential amplifier 21b provided with a signal input terminal IN, a reference terminal ref to which is supplied a reference signal for specifying the amplification center level and differential output terminals Q, QB. It is possible to vary the duties of the output signal Q and the output signal QB of the differential amplifier 21b by inputting a data signal DATA to the signal input terminal IN and a reference signal to the reference terminal ref and controlling the level of the reference signal. In other words, even if the duty of the data signal DATA is not 100%, it is possible to maintain the duty of the output signal output from the differential output terminals Q, QB at 100% by controlling the reference level.

Figure 13A:
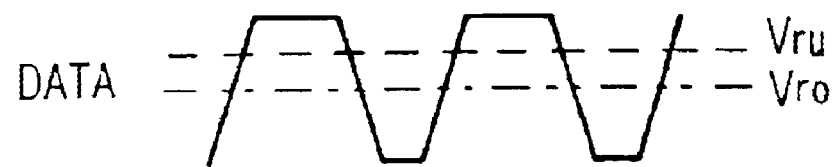
FIGS. 13A, 13B and 13C are explanatory views of an operation of the third embodiment of the present invention.
Figure 13B:
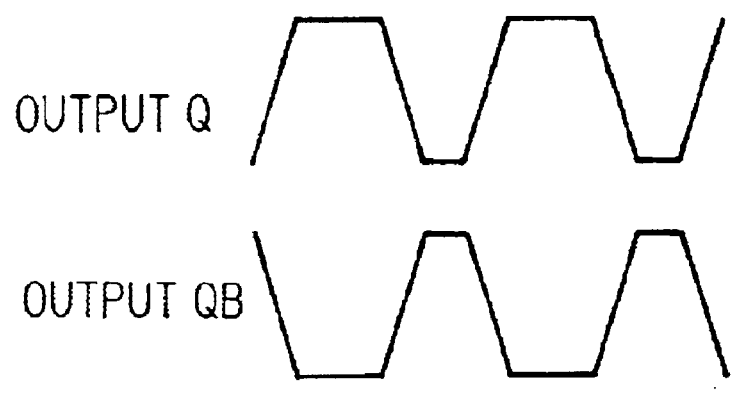
Figure 13C:
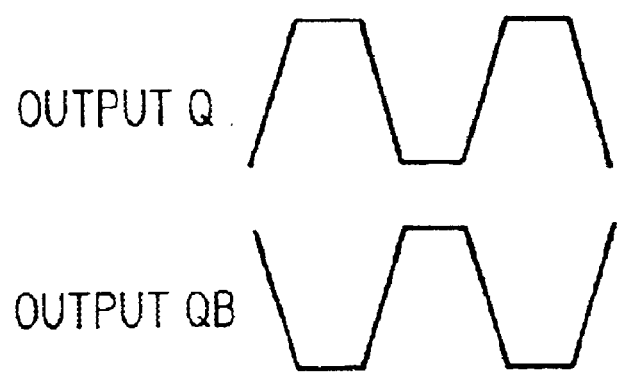
Figure 14A:
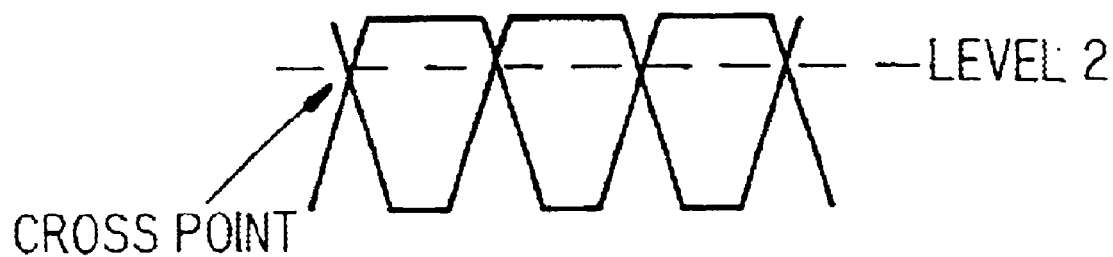
FIGS. 14A and 14B are explanatory views of another operation of the third embodiment of the present invention.
Figure 14B:
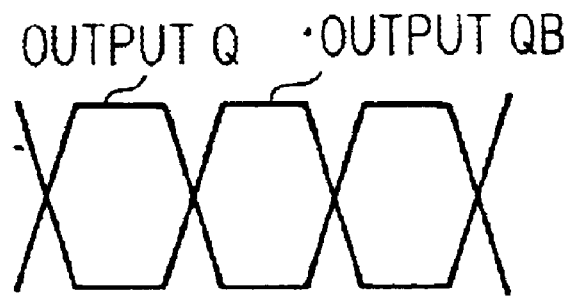

For example, when the duty of the input data signal DATA is more than 100%, as shown in FIG. 13A, if the reference level is set at Vr0, which is the center level of the data signal, it is impossible to maintain the duties of the outputs Q and QB at 100%, as shown in FIG. 13B. That is, the duty of the output Q becomes more than 100%, while the duty of the output QB becomes less than 100%. In contrast, if the reference level is set at Vru, which is larger than the center level Vr0 of the data signal, it is possible to maintain the duties of the outputs Q and QB at 100%, as shown in FIG. 13C.

The reference numeral 22 represents a duty monitoring portion for monitoring the duty of a data signal on the basis of the outputs Q and QB output of the differential amplifier 21b. The duty monitoring portion 22 is composed of a branching circuit 22a for branching the output signal Q output from the differential amplifier 21b in two directions, an averaging circuit 22b for obtaining and outputting the average value of one branched output signal Q, a branching circuit 22c for branching the output QB of the differential amplifier 21b in two directions, an averaging circuit 22d for obtaining and outputting the average value of one branched output signal QB. Each of the averaging circuits 22b, 22d is composed of, for example, an integrator which obtains the average value Vm of the branched data signal Q (QB) and outputs the average value as duty information. In the data signal DATA, the number of "1"s and the number of "0"s are made equal by scrambling processing. Therefore, the average values output from the average value circuits 22b, 22d are proportional to the duty of the data signal. When the duty of the data signal is 100%, the average values output from the averaging circuits 22b, 22d are equal. In other words, if these average values are made equal by feedback control, the duty of the output Q of the differential amplifier 21b is maintained at 100%.

The reference numeral 23 denotes a control circuit which determines the reference level of the amplifier 21b on the basis of the difference between the average values of the output signals Q and QB so that the difference in the average value is 0, that is, the duty of the output signal Q (data signal) output from the differential amplifier 21b is 100%, and inputs a control signal having this reference level to the reference terminal ref. The control circuit 23 is composed of an amplifier having a non-inverting input terminal and an inverting input terminal.

The reference numeral 24 represents a clock signal generator for generating a clock signal CLK for discriminating a data signal which is synchronous with the output signal Q (data signal) output from the differential amplifier 21b as the duty varying circuit via the branching circuit 22a. The clock signal generator 24 is composed of the conventional timing circuit shown in FIG. 20, or the conventional timing circuit shown in FIG. 21.

(b) Operation

In the third embodiment, the differential amplifier 21b in the duty varying circuit 21 amplifies an input signal with a predetermined reference level as the center, and outputs the amplified signal. The branching circuits 22a, 22c branch the output signal Q (data signal) and the output signal QB, respectively, in two directions, and the averaging circuits 22b, 22d calculate the average values $Vm_1$, $Vm_2$, respectively, of the data signal and inputs these values to the non-inverting input terminal and the inverting input terminal, respectively, of the amplifier 23a which constitutes the control circuit 23. The control circuit 23 determines the reference level on the basis of the difference between the average values $Vm_1$ and $Vm_2$, generates a control signal having the reference level and inputs it to the reference terminal ref of the differential amplifier 21b. The differential amplifier 21b amplifies the input signal with the new reference level as a center so as to bring the duties of the output signals Q and QB close to 100%.

This feedback control is repeated thereafter until the differential amplifier 21b generates the output signal Q (data signal) having a waveform of a duty 100% and inputs the data signal to the clock signal generator 24 via the branching circuit 22a. The clock signal generator 24 generates a clock signal CLK for discriminating a data signal which is synchronous with the data signal input from the differential amplifier 21b, and inputs the clock signal to the discriminating circuit (not shown) of an optical receiver.

As described above, according to the third embodiment, it is possible to maintain the duty of a data signal at 100% by feedback control by a simple structure and inputting it to the clock signal generator 24. Consequently, it is possible to stably generate a clock signal for discriminating the data signal even if the input waveform has a large distortion and the duty greatly changes, and a discriminating circuit is capable of accurately discriminating the input data signal and reproducing it.

In addition, in the third embodiment, since feedback control is carried out so that the levels of the output signals Q and QB are equal, it is not necessary to examine the relationship between the average value and the reference level, or the duty of a data signal and the reference level in advance.

(E) Fourth Embodiment (a) Structure

Figure 29:
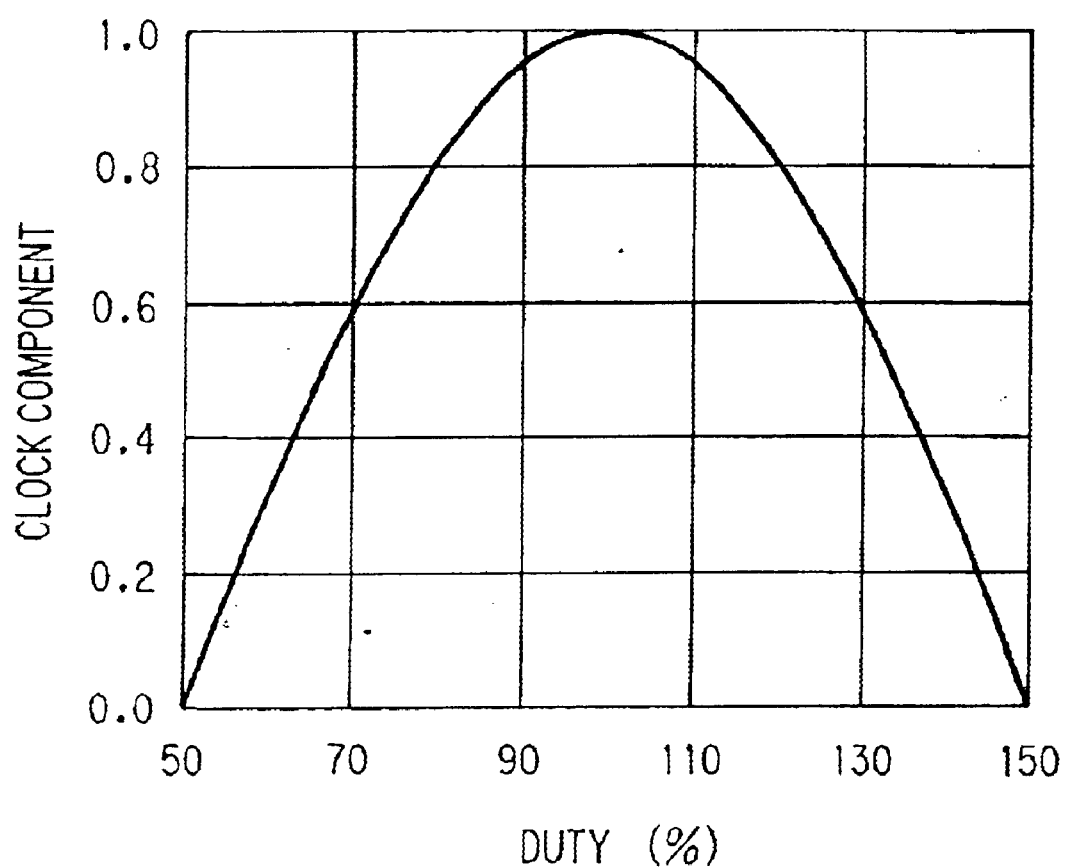
FIG. 29 shows the relationship between the duty of a data signal and an extracted clock component.

As the duty of a data signal is reduced or increased from 100%, the clock component contained in the signal nonlinearly extracted from the data signal is reduced (see FIG. 29). Therefore, if the clock component is detected and feedback control is executed so that the clock component is at its maximum, it is possible to maintain the duty at 100%.

Figure 15:
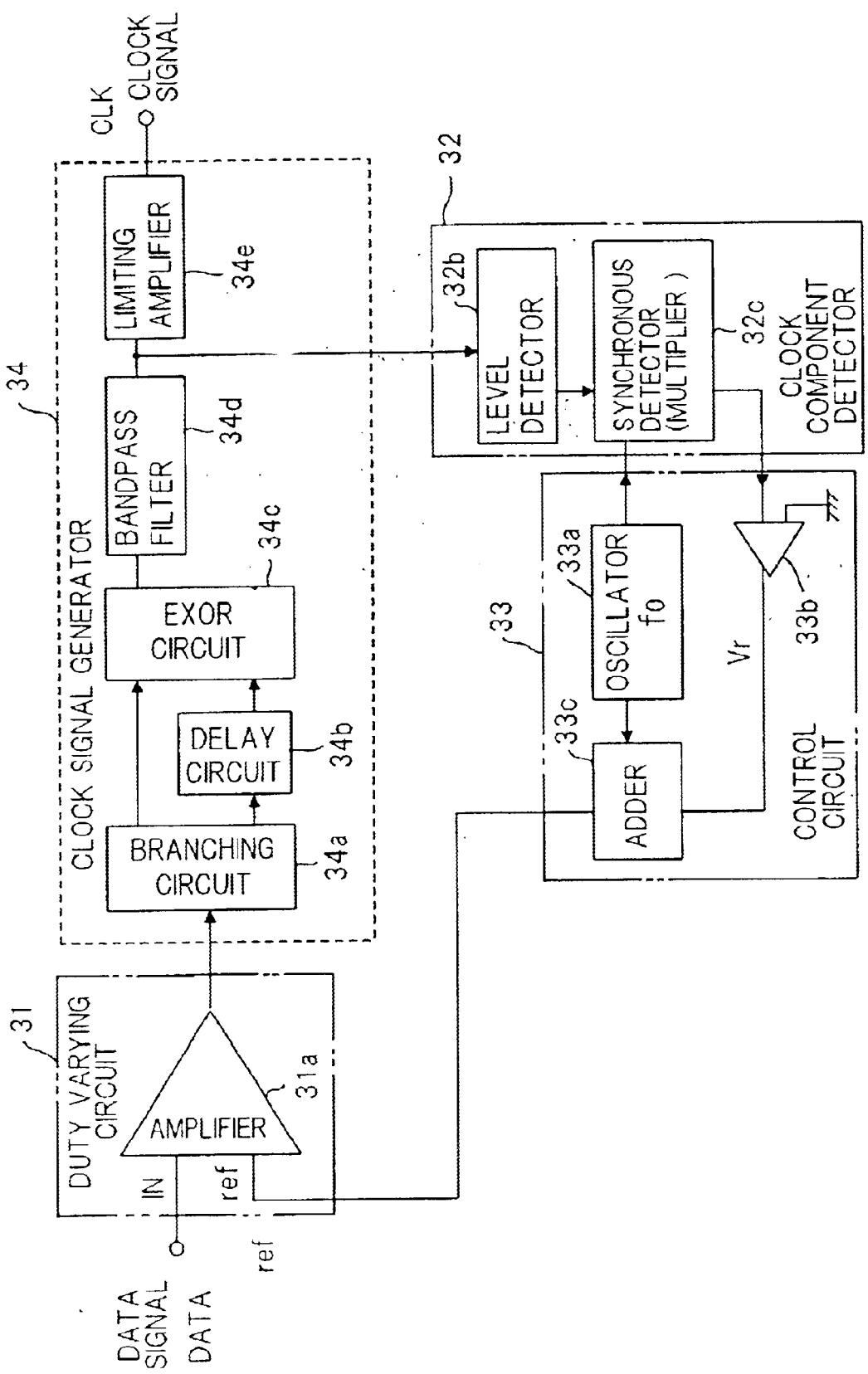
FIG. 15 shows the structure of a fourth embodiment of a timing circuit according to the present invention.

FIG. 15 shows the structure of a fourth embodiment of a timing circuit according to the present invention. The fourth embodiment is based on the above-described principle. In FIG. 15, the reference numeral 31 represents a duty varying circuit for varying the duty of a data signal DATA, 32 a clock component detector for detecting the magnitude of the clock component contained in the data signal, 33 a control circuit for executing feedback control so that the clock component is at its maximum, and 34 a clock signal generator for generating a clock signal CLK for discriminating a data signal which is synchronous with the data signal.

The duty varying circuit 21 is composed of an amplifier 31a provided with a signal input terminal IN and a reference terminal ref to which is supplied a reference signal for specifying the amplification center level. It is possible to vary the duty of the data signal output from the amplifier 31a by inputting the data signal to the signal input terminal IN and a reference signal to the reference terminal ref and controlling the level of the reference signal. For example, when the duty of the data signal DATA is 100%, as shown in FIG. 6A, the reference level is set at Vr0, which is the center level of the data signal. When the duty is more than 100%, as shown in FIG. 6B, the reference level is set at Vru, which is larger than the center level Vr0 of the data signal. When the duty is less than 100% (not shown), the reference level is set at a value smaller than Vr0, which is the center level of the data signal.

The clock signal generator 34 for generating a clock signal CLK for discriminating a data signal has the same structure as the timing circuit shown in FIG. 20. The clock signal generator 34 is composed of a branching circuit 34a for branching an input data signal in two directions, a delay circuit 34b for delaying one branched data signal by a predetermined time, an EXOR circuit 34c for executing an exclusive OR operation of the other branched data signal and the output signal of the delay circuit 34b and generating an edge signal having a pulse at the rising edge and the falling edge of the data signal, a bandpass filter 34d for extracting a clock component having the same frequency as the bit rate of the data signal from the output of the EXOR circuit 34c and outputting the extracted clock component, and a limiting amplifier 34e for amplifying a clock component to a predetermined amplitude.

The clock component detector 32 detects the magnitude of the clock component contained in the data signal, and it is provided with a level detector 32b which is connected to the output terminal of the bandpass filter 34d and a synchronous detector 32c for synchronously detecting and outputting a low-frequency $f_0$ component which is contained in the signal output from the level detector 32b.

The control circuit 33 determines the reference level of the amplifier 31a of the duty varying circuit 31 by feedback control so that the clock component is at its maximum, and inputs a control signal having this reference level to the reference terminal ref. The control circuit 33 is provided with an oscillator 33a for generating a microsignal having a low-frequency $f_0$, a reference signal generator 33b for generating a reference signal Vr so that the clock component is at its maximum, and an adder 33c for inputting the reference signal Vr with the microsignal superimposed thereon to the duty varying circuit 31.

(b) Operation

Figure 16:
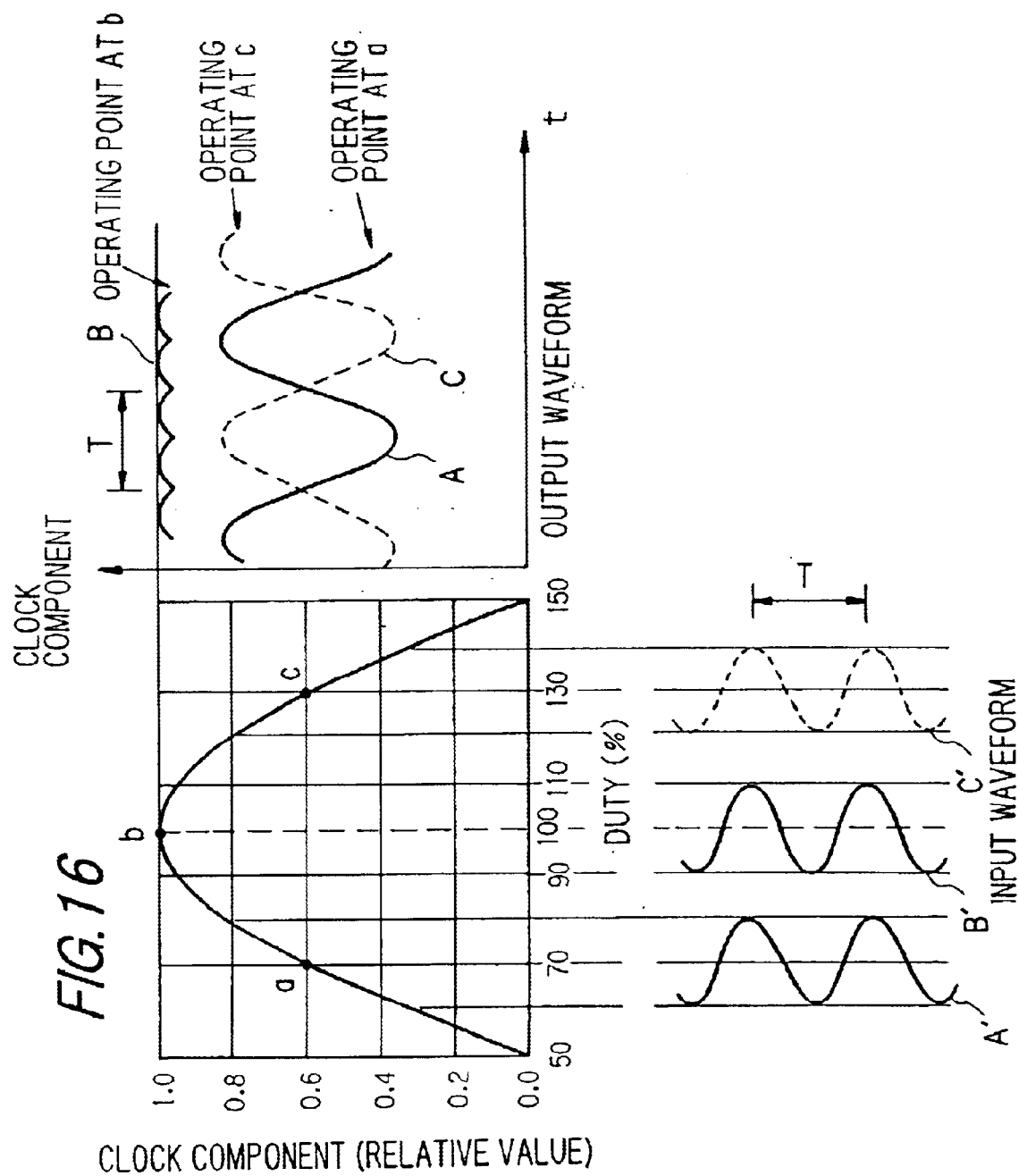
FIG. 16 is an explanatory view of the operation of the fourth embodiment of the present invention.

As shown in FIG. 16, as the duty of a data signal is reduced or increased from 100%, the clock component contained in the data signal and having the same frequency as the bit rate is reduced. If control signals A', B' and C' having a frequency $f_0$ are input to the reference terminal of the amplifier 31a so that the duty is provided with perturbation at the low frequency $f_0$, when the duties of the data signal are, for example, 70%, 100%, and 130%, respectively, the clock components contained in the signals output from the amplifier 31a are represented by A, B and C. That is, (1) when the duty is 70%, the clock component varies at a frequency of $f_0$, (2) when the duty is 130%, the clock component varies at a frequency of $f_0$ with the opposite phase to that of the clock component contained in the data signal when the duty is 70%, and (3) when the duty is 100%, the clock component varies at a frequency of $2f_0$.

Figure 17:
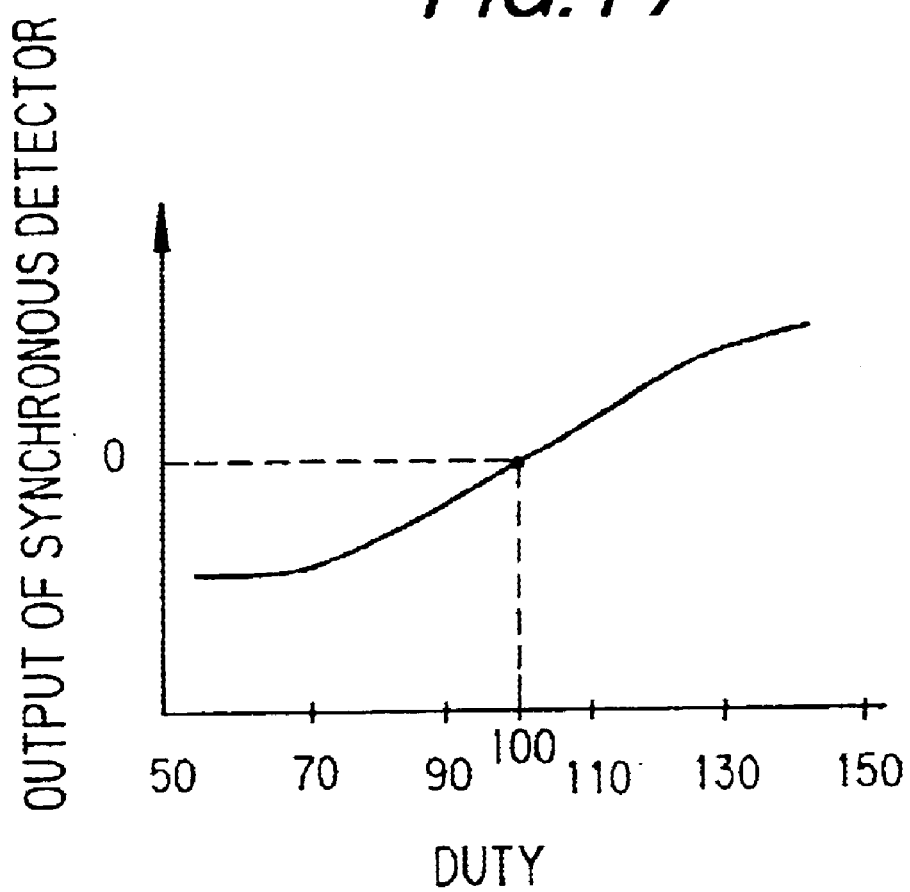
FIG. 17 is an explanatory view of the output of a synchronous detector.

Consequently, the output of the synchronous detector 32c which is obtained by multiplying the signal output from the level detector 32b by the low-frequency signal having a frequency of $f_0$ varies in correspondence with the duty, as shown in FIG. 17. In other words, the output of the synchronous detector 32c is zero when the duty is 100%, and the sign is inverted on this border. Accordingly, if the output of the synchronous detector 32c is so controlled as to become zero, it is possible to have the clock component at its maximum, namely, the duty of 100%.

A microsignal having a low frequency $f_0$ is input to the reference terminal of the amplifier 31a which constitutes the duty varying circuit 31 and the amplifier 31a outputs a data signal which is provided with perturbation at a low frequency. The clock signal generator 34 extracts a clock signal CLK from the data signal output from the amplifier 31a and outputs the extracted clock signal CLK. The clock component detector 32 detects the signal output from the bandpass filter 34d which constitutes the clock signal generator 34 in synchronism with a low-frequency signal having a frequency of $f_0$. The reference signal generator 33b of the control circuit 33 generates a reference signal Vr by amplifying the signal output from the synchronous detector 32c, and the adder 33c superimposes the low-frequency signal on the reference signal Vr and inputs them to the reference terminal ref of the amplifier 31a. Feedback control is then executed so that the duty of the signal output from the amplifier 31a becomes 100%, namely, the output of the synchronous detector 32c becomes zero. The same control is repeated thereafter until the duty of the data signal, which is the output of the amplifier 31a, becomes 100%. As a result, the clock signal generator 34 generates a clock signal CLK for discriminating a data signal which is synchronous with the data signal input from the amplifier 31a, and inputs the clock signal to the discriminating circuit (not shown) of an optical receiver such as that shown in FIG. 19.

As described above, according to the fourth embodiment, it is possible to maintain the duty of the data signal at 100% by feedback control, and it is possible to stably generate a clock signal for discriminating the data signal even if the input waveform has a large distortion and the duty greatly changes.

(c) Modification

In the fourth embodiment, the amplifier 31a is specially provided as the duty varying means. Among the digital circuits constituting the clock signal generator 34, there is a digital circuit provided with a signal input terminal and a reference terminal, for example, the EXOR circuit 34c. It is possible to substitute the amplifier built in the EXOR circuit 34c for the amplifier 31a as the duty varying means in the fourth embodiment.

Figure 18:
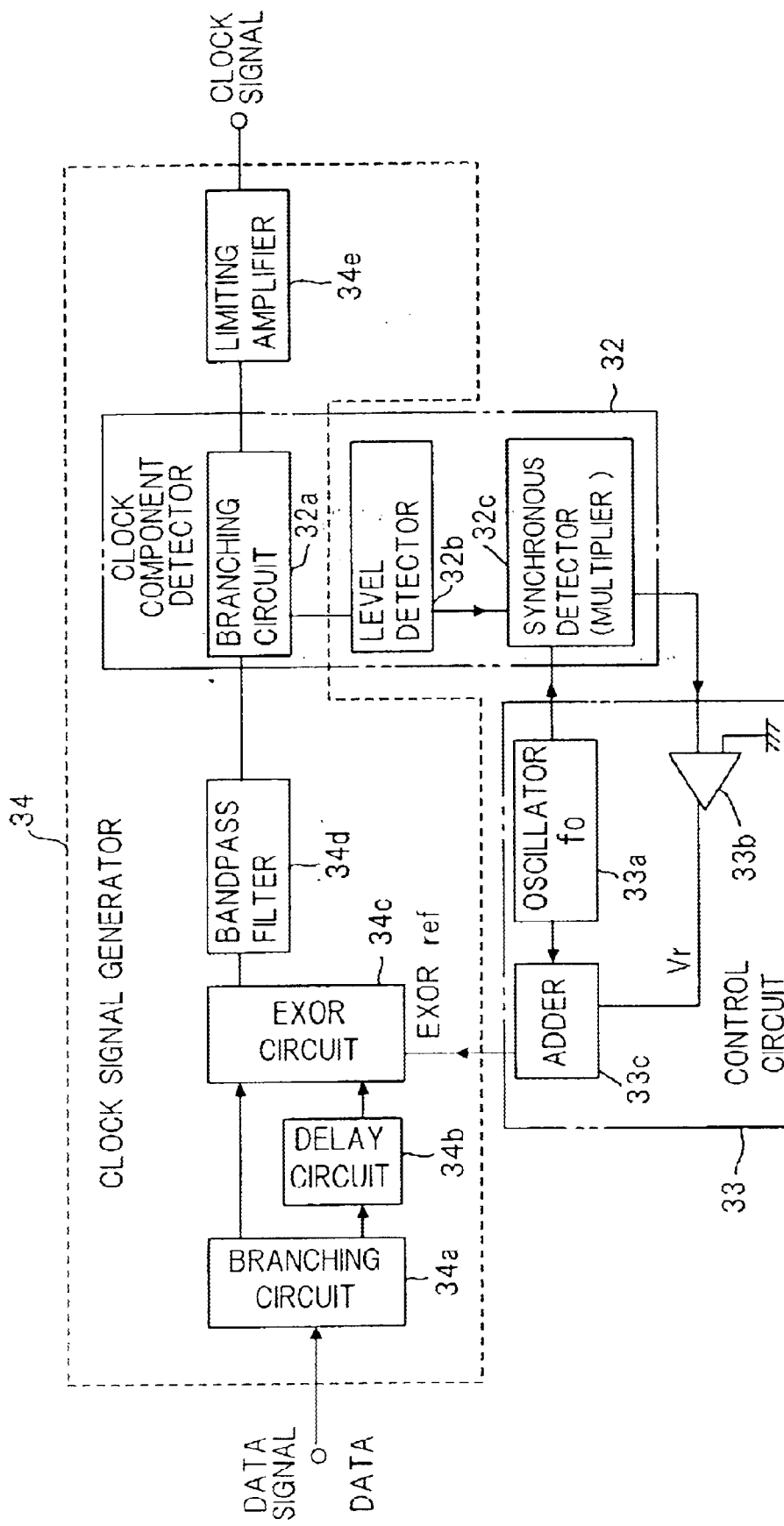
FIG. 18 shows a modification of the fourth embodiment of the present invention.

FIG. 18 shows the structure of a modification of the fourth embodiment of a timing circuit according to the present invention. The same reference numerals are provided for the elements which are the same as those in the fourth embodiment shown in FIG. 15. This modification is different from the fourth embodiment in (1) that the amplifier 31a as the duty varying means is eliminated, and (2) that the signal output from the control circuit 33 is input to the reference terminal of the EXOR circuit 34c.

The EXOR circuit 34c is composed of a digital IC and it is provided with two amplifiers 15c-1, 15c-2, and an EXOR gate 15c-3, as shown in FIG. 9. The amplifiers 15c-1, 15c-2 have signal input terminals IN1, IN2 and reference terminals ref1, ref2, respectively, and amplify input signals with the reference levels as the centers. Each of the amplifiers 15c-1, 15c-2 is capable of varying the duty of the output signal by varying the reference level, and is also capable of providing the duty of the output signal with perturbation by inputting a low-frequency signal to the reference terminal in the same way as in the amplifier 31a (fourth embodiment) shown in FIG. 15.

The duty of the output signal is varied by varying the reference level of the EXOR circuit by superimposing a signal having a low frequency $f_0$ on the reference signal Vr. Together with a change in the duty, the extracted clock component also varies. The output of the synchronous detector 32c for detecting the extracted clock component in synchronism with the low-frequency signal output from the oscillator 33a becomes zero when the clock component is at its maximum, and thereafter the sign is inverted. Accordingly, if the reference level is so controlled that the output of the synchronous detector 32c becomes zero; it is possible to have the clock component at its maximum, namely, the duty of 100%.

According to this modification, it is possible to constitute the duty varying means by the amplifier of a digital circuit (e.g., EXOR circuit) which constitutes the clock signal generator 34, so that it is possible to dispense with the amplifier 31a as the duty varying means in the fourth embodiment, thereby simplifying the circuit structure.

As explained above, according to the present invention, it is possible to maintain the duty of a data signal at 100% by feed-forward control by a simple structure, and therefore stably generate a clock signal for discriminating the data signal even if the input waveform has a large distortion and the duty greatly changes. In addition, since it is possible to substitute an amplifier built in a digital circuit (e.g., EXOR circuit) in the clock signal generator for the duty varying means, the circuit structure is simplified.

According to the present invention, it is possible to maintain the duty of a data signal at 100% by executing feedback control so that the average value of the data signal is a value corresponding to the duty 100%. It is therefore possible to stably generate a clock signal for discriminating the data signal even if the input waveform has a large distortion and the duty greatly changes.

According to the present invention, since the reference level of the differential amplifier to which a data signal is input is so controlled that the average values of the non-inverting signal and the inverting signal coincide with each other and the duty becomes 100%, it is not necessary to obtain and store the reference value in advance unlike feed-forward control, thereby simplifying control.

According to the present invention, since it is possible to maintain the duty at 100% by executing feedback control so that the clock component is at its maximum, it is possible to stably generate a clock signal for discriminating the data signal even if the input waveform has a large distortion and the duty greatly changes. In addition, since it is possible to substitute an amplifier built in a digital circuit (e.g., EXOR circuit) in the clock signal generator for the duty varying means, the circuit structure is simplified.

As many apparently widely different embodiments of the present invention can be made without departing from the spirit and scope thereof, it is to be understood that the invention is not limited to the specific embodiments thereof except as defined in the appended claims.

What is claimed is:

1. A timing circuit for generating a clock signal which indicates a timing for discriminating a data signal, said timing circuit comprising:

duty varying means for varying the duty of a data signal;

duty monitoring means for monitoring the duty of the data signal output from the duty varying means;

a control circuit controlling the duty varying means with the duty of the data signal to be output from the duty monitoring means having a predetermined value; and a clock signal generator generating a clock signal that is synchronous with the data signal output from the duty monitoring means and indicates a timing for discriminating the data signal;

wherein the duty varying means comprises an amplifier provided with a signal input terminal and a reference terminal to which is input a reference signal specifying an amplification center level, the control circuit controlling the amplification center level of the reference signal to generate the data signal output from the duty monitoring means with the predetermined value.

2. A timing circuit according to claim 1, wherein the duty monitoring means comprises an averaging circuit outputting the average value of the data signal as duty information.

3. A timing circuit according to claim 1, wherein the clock signal generator comprises a phase detector comparing the phase of the data signal output from the duty monitoring means with the phase of the clock signal and outputting the phase difference, a loop filter smoothing a voltage signal corresponding to the phase difference, and a voltage controlled oscillator generating a clock signal having a frequency corresponding to the output level of the loop filter.

4. A timing circuit for generating a clock signal that indicates a timing for discriminating a data signal, the timing circuit comprising:

duty varying means for varying the duty of a data signal;

duty monitoring means for monitoring the duty of the data signal output from the duty varying means;

a control circuit controlling the duty varying means with the duty of the data signal to be output from the duty monitoring means having a predetermined value; and a clock signal generator generating a clock signal that is synchronous with the data signal output from the duty monitoring means and indicates a timing for discriminating the data signal, wherein the duty varying means comprises a differential amplifier provided with a signal input terminal and a reference terminal for outputting a non-inverting signal and an inverting signal that correspond to the difference between the data signal and a reference signal respectively input to the signal input terminal and the reference terminal, wherein the duty monitoring means comprises averaging circuits outputting the average values of the non-inverting signal and the inverting signal, respectively, and wherein the control circuit controls the level of the reference signal of the differential amplifier and varies a center level of the amplification of the input signal, with the average values of the non-inverting signal and the inverting signal coinciding with each other.

5. A timing circuit for generating a clock signal that indicates a timing for discriminating a data signal, the timing circuit comprising:

duty varying means for varying the duty of a data signal;

duty monitoring means for monitoring the duty of the data signal output from the duty varying means;

a control circuit controlling the duty varying means with the duty of the data signal to be output from the duty monitoring means having a predetermined value; and a clock signal generator generating a clock signal that is synchronous with the data signal output from the duty monitoring means and indicates a timing for discriminating the data signal, wherein the clock signal generator comprises a branching circuit branching the data signal output from the duty monitoring means in two directions, a delay circuit delaying the first branched data signal, an EXOR circuit executing an exclusive OR operation of the second branched data signal and the output signal of the delay circuit, a bandpass filter that has a center frequency identical with the bit rate of the data signal, to which the output of the EXOR circuit is input, and that generates a frequency signal corresponding to the bit rate of the data signal, and a limiting amplifier amplifying the output of the bandpass filter to a predetermined amplitude.

* * * * *